United States Patent
Kitada et al.

(10) Patent No.: US 10,411,141 B2
(45) Date of Patent: Sep. 10, 2019

(54) SEMICONDUCTOR DEVICE AND METHOD OF MANUFACTURING SEMICONDUCTOR DEVICE

(71) Applicant: SHINDENGEN ELECTRIC MANUFACTURING CO., LTD., Chiyoda-ku, Tokyo (JP)

(72) Inventors: Mizue Kitada, Saitama (JP); Takeshi Asada, Saitama (JP); Takeshi Yamaguchi, Saitama (JP); Noriaki Suzuki, Saitama (JP); Daisuke Arai, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/060,416

(22) PCT Filed: Feb. 27, 2017

(86) PCT No.: PCT/JP2017/007575
§ 371 (c)(1),
(2) Date: Jun. 7, 2018

(87) PCT Pub. No.: WO2017/169447
PCT Pub. Date: Oct. 5, 2017

(65) Prior Publication Data
US 2019/0006526 A1    Jan. 3, 2019

(30) Foreign Application Priority Data

Mar. 31, 2016  (WO) .................. PCT/JP2016/060860

(51) Int. Cl.
*H01L 29/868* (2006.01)
*H01L 29/78* (2006.01)
(Continued)

(52) U.S. Cl.
CPC ........ *H01L 29/868* (2013.01); *H01L 29/0619* (2013.01); *H01L 29/0634* (2013.01);
(Continued)

(58) Field of Classification Search
CPC ............... H01L 29/868; H01L 29/7395; H01L 29/66734; H01L 29/66712; H01L 29/0649;
(Continued)

(56) References Cited

U.S. PATENT DOCUMENTS 6,849,880 B1    2/2005  Saito et al.
7,999,314 B2 *  8/2011  Tsuzuki ............ H01L 21/26586
                                           257/335
(Continued)

FOREIGN PATENT DOCUMENTS

EP    2290697 A1    3/2011
JP    2005-85990 A  3/2005
(Continued)

OTHER PUBLICATIONS

International Search Report in PCT/JP2017/007575, dated May 23, 2017, 4pp.

(Continued)

*Primary Examiner* — Dao H Nguyen
(74) *Attorney, Agent, or Firm* — Hauptman Ham, LLP

(57) ABSTRACT

A semiconductor device includes: a semiconductor base body where a second semiconductor layer is stacked on a first semiconductor layer, a trench is formed on a surface of the second semiconductor layer, and a third semiconductor layer which is formed of an epitaxial layer is formed in the inside of the trench; a first electrode; an interlayer insulation film which has a predetermined opening; and a second electrode, wherein metal is filled in the opening, the opening is disposed at a position avoiding a center portion of the third
(Continued)

semiconductor layer, the second electrode is connected to the third semiconductor layer through the metal, and a surface of the center portion of the third semiconductor layer is covered by the interlayer insulation film.

16 Claims, 15 Drawing Sheets

(51) Int. Cl.
 *H01L 29/872* (2006.01)
 *H01L 29/417* (2006.01)
 *H01L 29/66* (2006.01)
 *H01L 29/06* (2006.01)
 *H01L 29/739* (2006.01)

(52) U.S. Cl.
 CPC ...... *H01L 29/0649* (2013.01); *H01L 29/0696* (2013.01); *H01L 29/417* (2013.01); *H01L 29/66136* (2013.01); *H01L 29/66143* (2013.01); *H01L 29/66712* (2013.01); *H01L 29/66734* (2013.01); *H01L 29/7395* (2013.01); *H01L 29/7397* (2013.01); *H01L 29/78* (2013.01); *H01L 29/7802* (2013.01); *H01L 29/7813* (2013.01); *H01L 29/872* (2013.01); *H01L 29/0692* (2013.01)

(58) Field of Classification Search
 CPC ............ H01L 29/0696; H01L 29/0634; H01L 29/0619; H01L 29/7397; H01L 29/7802; H01L 29/7813; H01L 29/78; H01L 29/66143; H01L 29/872
 USPC ....... 257/329, 330, 334, 335, 341, 623, 656, 257/135, 144, E29.02, E29.021, E29.122, 257/E29.134, E29.169, E29.257, E29.262, 257/E21.09, E21.409; 438/198, 269, 272, 438/478, 492
 See application file for complete search history.

(56) References Cited

U.S. PATENT DOCUMENTS

| | | | |
|---|---|---|---|
| 8,829,607 | B1 | 9/2014 | Hsieh |
| 9,105,679 | B2* | 8/2015 | Laven ................. H01L 29/7397 |
| 2008/0116512 | A1 | 5/2008 | Kawaguchi et al. |
| 2011/0169081 | A1 | 7/2011 | Ishikawa et al. |
| 2014/0203356 | A1 | 7/2014 | Kagata et al. |
| 2015/0155380 | A1* | 6/2015 | Schulze ............. H01L 29/0649 257/330 |
| 2016/0118492 | A1* | 4/2016 | Asada ................. H01L 29/0634 257/334 |
| 2017/0110572 | A1* | 4/2017 | Zundel ............... H01L 29/0878 |

FOREIGN PATENT DOCUMENTS

| | | |
|---|---|---|
| JP | 2005-333068 A | 12/2005 |
| JP | 2006-140277 A | 6/2006 |
| JP | 2008-53418 A | 3/2008 |
| JP | 2008-153620 A | 7/2008 |
| TW | 201541639 A | 11/2015 |
| WO | 2015/151185 A1 | 10/2015 |

OTHER PUBLICATIONS

International Search Report in PCT/JP2016/060860, dated Jul. 5, 2016, 4pp.
Search Report in NL Application No. 2018612, dated Dec. 13, 2017, 11pp.

* cited by examiner

SEMICONDUCTOR DEVICE AND METHOD OF MANUFACTURING SEMICONDUCTOR DEVICE

RELATED APPLICATIONS

The present application is a National Phase of International Application Number PCT/JP2017/007575, filed Feb. 27, 2017, which claims priority to International Application Number PCT/JP2016/060860, filed Mar. 31, 2016.

TECHNICAL FIELD

The present invention relates to a semiconductor device and a method of manufacturing a semiconductor device.

BACKGROUND ART

Conventionally, there has been known a MOSFET which includes a semiconductor base body where a trench having a predetermined depth is formed on a surface of an n-type semiconductor layer, and a p-type semiconductor layer formed of an epitaxial layer is formed in the inside of the trench (see patent literature 1, for example).

As shown in FIG. 21, the conventional MOSFET 700 is a planar gate type MOSFET including: a semiconductor base body 710 where an n$^-$-type second semiconductor layer 714 is stacked on an n$^+$-type first semiconductor layer 712, a plurality of trenches 718 having a predetermined depth which are arranged along a predetermined direction are formed on a surface of the second semiconductor layer 714, a p$^-$-type third semiconductor layer 716 formed of an epitaxial layer is formed in the inside of the trench 718 (see semiconductor base body 710' shown in FIG. 22), a p-type base layer 720 is formed on a portion of a surface of the second semiconductor layer 714 and a whole surface of the third semiconductor layer 716, and an n-type first-conductive-type high concentration diffusion region 740 (source region 740) is formed on a portion of a surface of the base layer 720; a first electrode 726 (drain electrode) which is positioned on a surface of the first semiconductor layer 712; an interlayer insulation film 722 which is positioned on a surface of the second semiconductor layer 714 and on a surface of the third semiconductor layer 716 and has a predetermined opening 728 formed within a region where the third semiconductor layer 716 is formed as viewed in a plan view; a second electrode 724 (source electrode) which is positioned over the interlayer insulation film 722; and a gate electrode 744 which is formed so as to cover at least a base layer 720 sandwiched between the source region 740 and the second semiconductor layer 714 by way of a gate insulation film 742.

In the conventional MOSFET 700, assuming a portion of a region of the second semiconductor layer 714 sandwiched between the trenches 718 disposed adjacently to each other and deeper than the base layer 720 as a first column 1C, and a portion of the third semiconductor layer 716 deeper than the base layer 720 as a second column 2C, and a super junction structure is formed of the first column 1C and the second column 2C.

In the conventional MOSFET 700, metal for forming the second electrode 724 is filled into the inside of the opening 728 directly, and the second electrode 724 is directly connected to the third semiconductor layer 716 (to be more specific, the source region 740 and the base layer 720).

In such a conventional MOSFET 700, the third semiconductor layer 716 is formed by forming the trench 718 in the second semiconductor layer 714 and by filling the trench 718 with a p-type epitaxial layer.

According to the conventional MOSFET 700, since the super junction structure is formed of the first column 1C and the second column 2C as viewed in a plan view and hence, it is possible to provide a MOSFET having a high breakdown strength and a low ON voltage.

CITATION LIST

Patent Literature

PTL 1: JP-A-2006-140277

SUMMARY OF INVENTION

Technical Problem

However, when the trench 718 is formed in the n-type semiconductor layer (second semiconductor layer 714) and the trench 718 is filled with the p-type epitaxial layer, it is ideal that the whole inside of the trench 718 be completely filled with the p-type epitaxial layer. In an actual filling operation, there may be a case where a cavity S (slit-like cavity, crevasse-like cavity, void-like cavity or the like) remains in the inside of the third semiconductor layer 716 at a center portion of the third semiconductor layer 716 as viewed in a plan view (see FIG. 21). Accordingly, there may be a case where in establishing contact between the third semiconductor layer 716 and the second electrode 724, metal for forming the second electrode 724 enters the inside of the cavity S and the metal in the cavity S generates an electrode potential. In this case, when a negative potential is applied to the second electrode 724, a depletion layer extending toward the second electrode 724 side from a pn junction surface between the second semiconductor layer 714 and the third semiconductor layer 716 is brought into contact with the metal in the cavity S so that a breakdown in a reach through mode occurs thus giving rise to a drawback that a breakdown strength cannot be maintained (see a region surrounded by a chain line A in FIG. 23).

Such a drawback is a drawback which occurs not only in MOSFETs but also in diodes, IGBTs and the like. Such a drawback is also a drawback which occurs not only in a case where a trench formed in an n-type semiconductor layer is filled with a p-type epitaxial layer but also in a case where a trench formed in a p-type semiconductor layer is filled with an n-type epitaxial layer. Still further, such a drawback is a drawback which occurs not only in a semiconductor device which has a super junction structure but also in a semiconductor device which does not have a super junction structure.

The present invention has been made to overcome the above-mentioned drawbacks, and it is an object of the present invention to provide a semiconductor device where a breakdown in a reach through mode minimally occurs so that a breakdown strength is minimally lowered while having a semiconductor base body where a third semiconductor layer formed of an epitaxial layer is formed in a trench. It is another object of the present invention to provide a method of manufacturing a semiconductor device for manufacturing such a semiconductor device.

Solution to Problem

[1] A semiconductor device according to the present invention is a semiconductor device which includes: a semiconductor base body where a second semiconductor layer of a first conductive type is stacked on a first semiconductor layer of the first conductive type or a second conductive type, a trench having a predetermined depth is formed on a surface of the second semiconductor layer, and a third semiconductor layer of the second conductive type which is formed of a monocrystal epitaxial layer is formed in the inside of the trench, a first electrode which is positioned on a surface of the first semiconductor layer; an interlayer insulation film which is positioned on a surface of the second semiconductor layer and on a surface of the third semiconductor layer and has a predetermined opening formed within a region where at least the third semiconductor layer is formed as viewed in a plan view, the opening being filled with metal; and a second electrode which is positioned over the interlayer insulation film, wherein the opening is disposed at a position avoiding a center portion of the third semiconductor layer as viewed in a plan view, the second electrode is connected to at least the third semiconductor layer through the metal filled in the opening, and a surface of the center portion of the third semiconductor layer is covered by the interlayer insulation film.

In this specification, even when a dopant of a first conductive type or a dopant of a second conductive type is introduced into a surface of the second semiconductor layer or a surface of the third semiconductor layer so that other layers or other regions (for example, the base layer, the high concentration region of a first conductive type or the like) is formed, it is assumed that portions where the other layers or other regions are formed also form the second semiconductor layer or the third semiconductor layer (see FIG. 22). On the other hand, when a new trench is formed on the surface of the second semiconductor layer or the surface of the third semiconductor layer (the new trench being different from the trench formed on the surface of the second semiconductor layer for forming the third semiconductor layer) so that a structure different from the second semiconductor layer and the third semiconductor layer is formed (for example, a trench gate structure or the like), the structure forms neither the second semiconductor layer nor the third semiconductor layer.

The term "predetermined depth" in "a plurality of trenches having a predetermined depth are formed on a surface of the second semiconductor layer" includes a depth by which the trench reaches a boundary surface between the second semiconductor layer and the third semiconductor layer.

The term "interlayer insulation film" means a relatively thick insulation film which is formed between the electrode (second electrode) and the semiconductor base body or between the electrode and other electrode (gate electrode) so as to realize the insulation between the electrode (second electrode) and the semiconductor base body or between the electrode and other electrode (gate electrode).

The phrase "a center portion of the third semiconductor layer as viewed in a plan view" means a region at a middle point between the side walls of the trenches which face each other and in the vicinity of the middle point as viewed in a plan view, and the phrase "a center of the third semiconductor layer as viewed in a plan view" means a middle point between the side walls of the trenches which face each other as viewed in a plan view.

The term "opening" means a region where the interlayer insulation film is not formed. For example, even when the interlayer insulation film is formed in an island shape, the region where such an interlayer insulation film is not formed means the opening.

[2] In the semiconductor device of the present invention, it is preferable that a length from a center of the third semiconductor layer to a side wall of the opening closest to the center of the third semiconductor layer out of the side walls of the opening be set to 0.1 μm or more as viewed in a plan view.

[3] In the semiconductor device of the present invention, it is preferable that the semiconductor device further include a metal plug which is formed by filling the inside of the opening with metal which differs from metal for forming the second electrode, and the second electrode be connected to at least the third semiconductor layer through the metal plug.

[4] In the semiconductor device of the present invention, it is preferable that metal for forming the second electrode be filled in the opening directly, and the second electrode be directly connected to at least the third semiconductor layer.

[5] In the semiconductor device of the present invention, it is preferable that a fourth semiconductor layer of the second conductive type be formed on at least a portion of a surface of the second semiconductor layer and on a surface of the third semiconductor layer of the semiconductor base body, and assuming a portion of the second semiconductor layer sandwiched between the trenches disposed adjacently to each other and being deeper than the fourth semiconductor layer as a first column and assuming a portion of the third semiconductor layer deeper than the fourth semiconductor layer as a second column, a super junction structure be formed of the first column and the second column.

[6] In the semiconductor device of the present invention, it is preferable that the semiconductor device be a PIN diode where the fourth semiconductor layer is formed on a whole surface of the second semiconductor layer and a whole surface of the third semiconductor layer, and the second electrode is connected to the fourth semiconductor layer.

[7] In the semiconductor device of the present invention, it is preferable that the semiconductor base body be configured such that the first semiconductor layer is a semiconductor layer of the first conductive type, the fourth semiconductor layer is a base layer which is formed on a whole surface of the second semiconductor layer and on a whole surface of the third semiconductor layer, a high concentration diffusion region of the first conductive type is formed on a surface of the fourth semiconductor layer, and the semiconductor device is a MOSFET of a trench gate type which further comprises: a gate trench which is positioned in a region where the trench is not formed as viewed in a plan view, and is formed such that the gate trench extends to a depth position deeper than a deepest portion of the fourth semiconductor layer, and a portion of the high concentration diffusion region of the first conductive type is exposed on an inner peripheral surface of the gate trench; a gate insulation film formed on the inner peripheral surface of the gate trench, and a gate electrode which is filled in the gate trench with the gate insulation film interposed therebetween, and the second electrode is connected to the fourth semiconductor layer and the high concentration diffusion region of the first conductive type.

[8] In the semiconductor device of the present invention, it is preferable that the semiconductor base body be configured such that the first semiconductor layer is a semiconductor layer of the first conductive type, the fourth semiconductor layer be a base layer which is formed on a portion of the surface of the second semiconductor layer and a whole surface of the third semiconductor layer, a high concentration diffusion region of the first conductive type is formed on a portion of a surface of the fourth semiconductor layer, and the semiconductor device be a MOSFET of a planar gate type which further comprises a gate electrode by way of a gate insulation film such that the gate electrode covers at least the fourth semiconductor layer sandwiched between the high concentration diffusion region of the first conductive type and the second semiconductor layer, and the second electrode be connected to the fourth semiconductor layer and the high concentration diffusion region of the first conductive type.

[9] In the semiconductor device of the present invention, it is preferable that the semiconductor base body be configured such that the first semiconductor layer is a semiconductor layer of the second conductive type, the fourth semiconductor layer is a base layer which is formed on a whole surface of the second semiconductor layer and a whole surface of the third semiconductor layer, a high concentration diffusion region of the first conductive type is formed on a surface of the fourth semiconductor layer, and the semiconductor device be an IGBT of a trench gate type which further includes: a gate trench which is positioned in a region where the trench is not formed as viewed in a plan view, and is formed such that the gate trench extends to a depth position deeper than a deepest portion of the fourth semiconductor layer, and a portion of the high concentration diffusion region of the first conductive type is exposed on an inner peripheral surface of the gate trench; a gate insulation film formed on the inner peripheral surface of the gate trench, and a gate electrode which is filled in the gate trench with the gate insulation film interposed therebetween, and the second electrode be connected to the fourth semiconductor layer and the high concentration diffusion region of the first conductive type.

[10] In the semiconductor device of the present invention, it is preferable that the semiconductor base body be configured such that the first semiconductor layer is a semiconductor layer of the second conductive type, the fourth semiconductor layer is a base layer which is formed on a portion of the surface of the second semiconductor layer and a whole surface of the third semiconductor layer, a high concentration diffusion region of the first conductive type is formed on a portion of a surface of the fourth semiconductor layer, and the semiconductor device be an IGBT of a planar gate type which further comprises a gate electrode by way of a gate insulation film such that the gate electrode covers at least the fourth semiconductor layer sandwiched between the high concentration diffusion region of the first conductive type and the second semiconductor layer, and the second electrode be connected to the fourth semiconductor layer and the high concentration diffusion region of the first conductive type.

[11] In the semiconductor device of the present invention, it is preferable that a high concentration diffusion region of the second conductive type having higher dopant concentration than the fourth semiconductor layer be formed right below the opening so as to be in contact with a bottom surface of the opening.

[12] In the semiconductor device of the present invention, it is preferable that assuming a portion of the second semiconductor layer sandwiched between the trenches disposed adjacently to each other as a first column and assuming a portion of the third semiconductor layer as a second column, a super junction structure be formed of the first column and the second column.

[13] In the semiconductor device of the present invention, it is preferable that the semiconductor device be a Schottky barrier diode where the metal is a barrier metal, and the second electrode be connected to the second semiconductor layer in addition to the third semiconductor layer.

[14] In the semiconductor device of the present invention, it is preferable that the second semiconductor layer be formed of a monocrystal epitaxial layer.

[15] A first method of manufacturing a semiconductor device according to the present invention is a method of manufacturing a semiconductor device for manufacturing the semiconductor device described in any one of [1] to [14], the method including in the following order: a semiconductor base body preparation step of preparing the semiconductor base body where the second semiconductor layer of the first conductive type is stacked on the first semiconductor layer of the first conductive type or the second conductive type, the trench having the predetermined depth is formed on the surface of the second semiconductor layer, and the third semiconductor layer of the second conductive type which is formed of the monocrystal epitaxial layer is formed in the inside of the trench; an interlayer insulation film forming step of forming the interlayer insulation film on the surface of the second semiconductor layer and the surface of the third semiconductor layer; an opening forming step of forming the predetermined opening in the interlayer insulation film within at least the region where the third semiconductor layer is formed as viewed in a plan view; a metal plug forming step of forming a metal plug by filling metal which differs from metal for forming the second electrode in the opening; and an electrode forming step of forming the first electrode on the surface of the first semiconductor layer and the second electrode connected to at least the third semiconductor layer on the interlayer insulation film through the metal plug, wherein the opening is formed at the position avoiding the center portion of the third semiconductor layer as viewed in a plan view in the opening forming step, and a surface of the center portion of the third semiconductor layer is covered by the interlayer insulation film in the opening forming step, the metal plug forming step and the electrode forming step.

[16] A second method of manufacturing a semiconductor device of the present invention is a method of manufacturing a semiconductor device for manufacturing the semiconductor device described in any one of [1] to [14], the method including in the following order: a semiconductor base body preparation step of preparing the semiconductor base body where the second semiconductor layer of the first conductive type is stacked on the first semiconductor layer of the first conductive type or the second conductive type, the trench having the predetermined depth is formed on the surface of the second semiconductor layer, and the third semiconductor layer of the second conductive type which is formed of the monocrystal epitaxial layer is formed in the inside of the trench; an interlayer insulation film forming step of forming the interlayer insulation film on the surface of the second semiconductor layer and the surface of the third semiconductor layer; an opening forming step of forming the predetermined opening in the interlayer insulation film within at least the region where the third semiconductor layer is formed as viewed in a plan view; and an electrode forming step which includes: a step of forming the first electrode on a surface of the first semiconductor layer; and a step of forming the second electrode on the interlayer insulation film where metal for forming the second electrode is directly filled in the opening so as to bring the second electrode in direct contact with at least the third semiconductor layer, wherein the opening is formed at the position avoiding the center portion of the third semiconductor layer as viewed in a plan view in the opening forming step, and a surface of the center portion of the third semiconductor layer is covered by the interlayer insulation film in the opening forming step and the electrode forming step.

Advantageous Effects of Invention

According to the semiconductor device of the present invention, the opening is disposed at the position avoiding the center portion of the third semiconductor layer as viewed in a plan view, and the surface of the center portion of the third semiconductor layer is covered by the interlayer insulation film. Accordingly, in forming the third semiconductor layer, even when a cavity having a slit shape, a crevasse shape or a void shape remains in the third semiconductor layer at the center of the third semiconductor layer as viewed in a plan view, in establishing contact between the third semiconductor layer and the second electrode, there is no possibility that metal for forming the second electrode enters the inside of the cavity and hence, there is no possibility that metal in the inside of the cavity becomes an electrode potential. Accordingly, even when a negative potential is applied to the second electrode, there arises only a phenomenon where a depletion layer extending toward a second electrode side from a pn junction surface between the second semiconductor layer and the third semiconductor layer is brought into contact with the above-mentioned cavity. Accordingly, it is possible to provide a semiconductor device where breakdown in a reach through mode minimally occurs so that lowering of a breakdown strength is minimized.

A silicon surface in the inside of the cavity is stabilized by being oxidized in an oxidization step which is a semiconductor preliminary step or by terminating a dangling bond by hydrogen in an annealing step so that even when a depletion layer reaches the cavity, there arises only a phenomenon where the depletion layer is brought into contact with the above-mentioned cavity. Accordingly, there is no possibility that a leak current is suddenly increased or a breakdown occurs.

Further, according to the semiconductor device of the present invention, the semiconductor device includes the interlayer insulation film having the predetermined opening formed within the region where at least the third semiconductor layer is formed as viewed in a plan view. Accordingly, in avalanche breakdown or during reverse recovery of a body diode, holes generated in the third semiconductor layer can be easily extracted. As a result, an L-load avalanche breakdown resistance can be increased.

According to the first method of manufacturing a semiconductor device and the second method of manufacturing a semiconductor device of the present invention, the methods include the opening forming step of forming the predetermined opening in the interlayer insulation film at the position avoiding the center portion of the third semiconductor layer as viewed in a plan view, and the surface of the center portion of the third semiconductor layer is covered by the interlayer insulation film in the electrode forming step. Accordingly, in forming the third semiconductor layer, even when a cavity having a slit shape, a crevasse shape or a void shape remains in the third semiconductor layer at the center of the third semiconductor layer as viewed in a plan view, in establishing contact between the third semiconductor layer and the second electrode in the electrode forming step, there is no possibility that metal for forming the second electrode enters the inside of the cavity and hence, there is no possibility that metal in the inside of the cavity becomes an electrode potential. Accordingly, in the manufactured semiconductor device, even when a negative potential is applied to the second electrode, there arises only a phenomenon where a depletion layer extending toward a second electrode side from a pn junction surface between the second semiconductor layer and the third semiconductor layer is brought into contact with the cavity. Accordingly, it is possible to manufacture a semiconductor device where breakdown in a reach through mode minimally occurs so that lowering of a breakdown strength is minimized.

Further, according to the method of manufacturing a semiconductor device of the present invention, the method includes the opening forming step of forming the predetermined opening in the interlayer insulation film within the region where at least the third semiconductor layer is formed as viewed in a plan view. Accordingly, in the manufactured semiconductor device, in avalanche breakdown or during reverse recovery of a body diode, holes generated in the third semiconductor layer can be easily extracted. As a result, it is possible to manufacture a semiconductor device having a large L-load avalanche breakdown resistance.

BRIEF DESCRIPTION OF DRAWINGS

FIG. 1A and FIG. 1B are views showing a semiconductor device 100 according to an embodiment 1, wherein FIG. 1A is an enlarged cross-sectional view of a main part of the semiconductor device 100, and FIG. 1B is an enlarged plan view of the main part of the semiconductor device 100.

FIG. 2A to FIG. 2D are enlarged cross-sectional views of a main part for describing a method of manufacturing a semiconductor device according to the embodiment 1, wherein FIG. 2A to FIG. 2D are views showing respective steps.

FIG. 3A to FIG. 3D are enlarged cross-sectional views of the main part for describing the method of manufacturing a semiconductor device according to the embodiment 1, wherein FIG. 3A to FIG. 3D are views showing respective steps.

FIG. 4A to FIG. 4C are enlarged cross-sectional views of the main part for describing the method of manufacturing a semiconductor device according to the embodiment 1, wherein FIG. 4A to FIG. 4C are views showing respective steps.

FIG. 5A to FIG. 5C are enlarged cross-sectional views of the main part for describing the method of manufacturing a semiconductor device according to the embodiment 1, wherein FIG. 5A to FIG. 5C are views showing respective steps.

FIG. 6A and FIG. 6B are views for describing advantageous effects of the semiconductor device 100 according to the embodiment 1, wherein FIG. 6A is an enlarged cross-sectional view of a main part of the semiconductor device 100 showing a state of the semiconductor device 100 when a reverse bias is applied, and FIG. 6B is an enlarged cross-sectional view of a main part of the semiconductor device 900 according to a comparison example showing a state of the semiconductor device 900 when a reverse bias is applied. Although the semiconductor device 900 according to the comparison example basically has substantially the same configuration as the semiconductor device 100 according to the embodiment 1, the semiconductor device 900 is a semiconductor device where an opening 928 (and a metal plug 930) is formed at a center portion of a third semiconductor layer 916 as viewed in a plan view. In FIG. 6A and FIG. 6B, for the sake of brevity of the description, the illustration of p-type high-concentration diffusion regions 132, 932 is omitted.

FIG. 9A and FIG. 9B are views showing a semiconductor device 200 according to an embodiment 4, wherein FIG. 9A is an enlarged cross-sectional view of a main part of the semiconductor device 200, and FIG. 9B is an enlarged plan view of the main part of the semiconductor device 200.

DESCRIPTION OF EMBODIMENTS

Figure 1A:
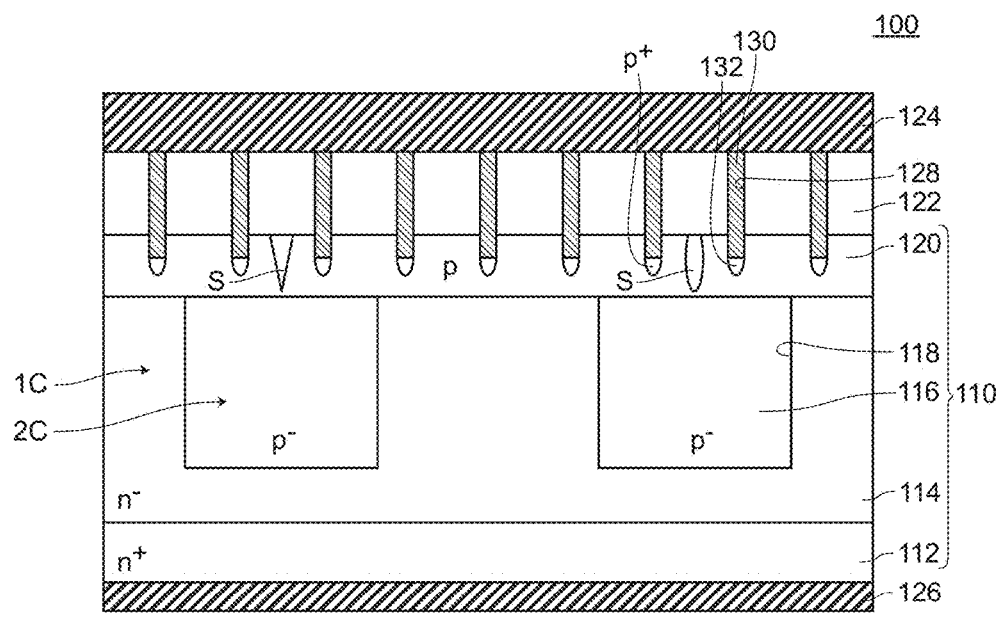

Hereinafter, a semiconductor device and a method of manufacturing a semiconductor device of the present invention are described based on embodiments shown in the drawings. The respective drawings are schematic views, and it is not always the case that the respective drawings strictly reflect actual size.

Embodiment 1

1. Configuration of Semiconductor Device 100 According to Embodiment 1

Figure 1B:
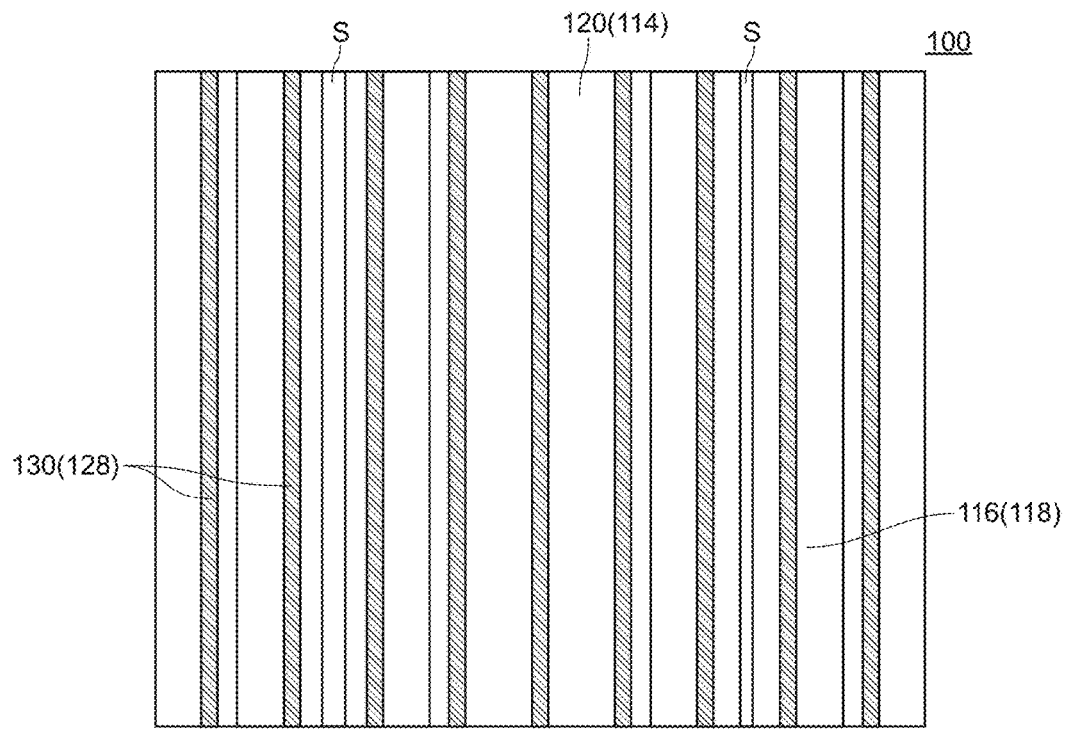
Figure 22:
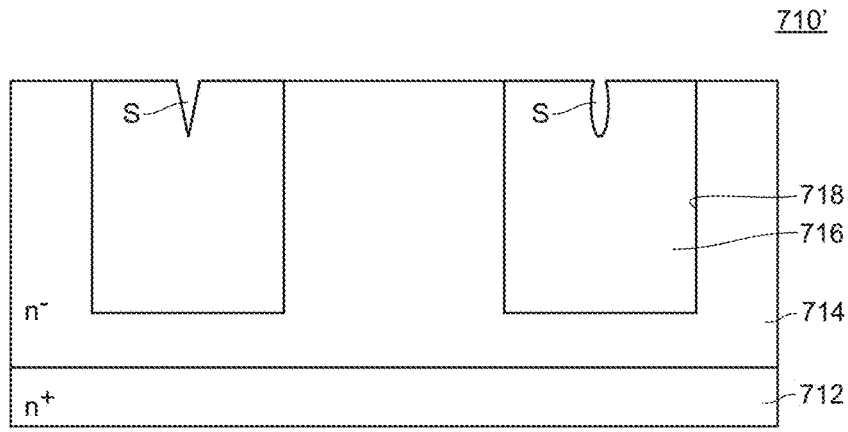
FIG. 22 is a view showing a semiconductor base body in this specification.
Figure 23:
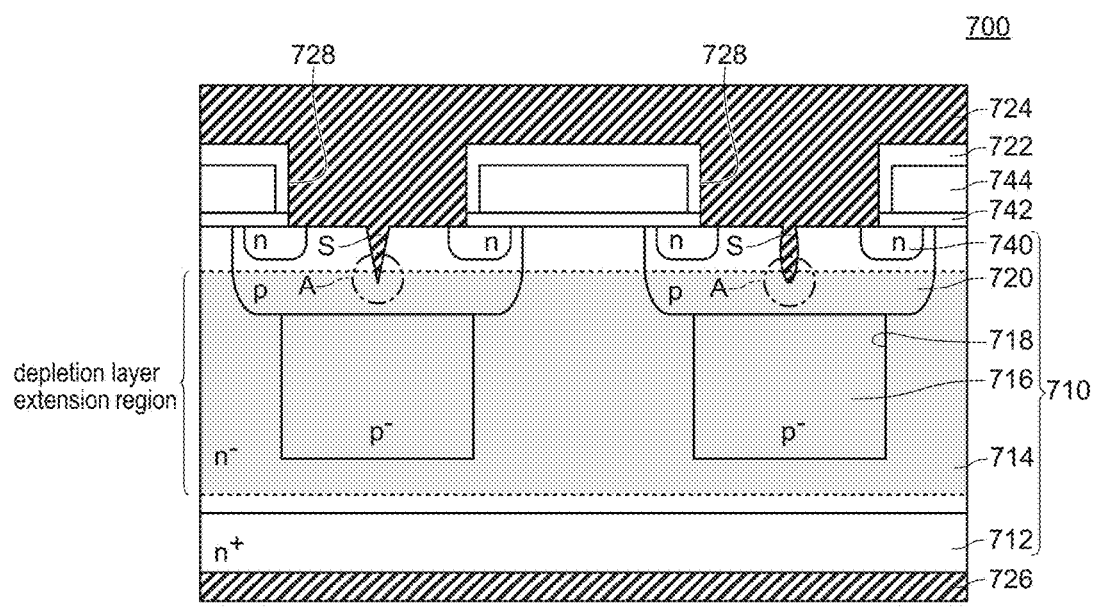
FIG. 23 is an enlarged cross-sectional view showing a main part for describing problems of the conventional MOSFET 700.

As shown in FIG. 1, the semiconductor device 100 according to the embodiment 1 is a PIN diode including: a semiconductor base body 110 (having substantially the same configuration as the semiconductor base body 710', see FIG. 22) where an n⁻-type second semiconductor layer 114 is stacked on an n⁺-type first semiconductor layer 112, a plurality of trenches 118 having a predetermined depth and arranged along a predetermined direction are formed on a surface of the second semiconductor layer 114, and a p⁻-type third semiconductor layer 116 formed of a monocrystal epitaxial layer is formed in the inside of the trench 118 (a whole inside of the trench 118); a first electrode 126 which is positioned on a surface of the first semiconductor layer 112; an interlayer insulation film 122 which is positioned on a surface of the second semiconductor layer 114 and on a surface of the third semiconductor layer 116 and has predetermined openings 128 formed within a region where at least the third semiconductor layer 116 is formed as viewed in a plan view; a second electrode 124 (made of aluminum, for example) which is positioned over the interlayer insulation film 122; and metal plugs 130 which are formed by filling the inside of the openings 128 with metal (for example, tungsten) which differs from metal for forming the second electrode 124. The second semiconductor layer 114 is formed of a monocrystal epitaxial layer.

A p-type fourth semiconductor layer 120 is formed on the whole surface of the second semiconductor layer 114 and the whole surfaces of the third semiconductor layer 116 of the semiconductor base body 110, and a p⁺-type high concentration diffusion region (second conductive high concentration diffusion region) 132 having higher dopant concentration than the fourth semiconductor layer 120 is formed directly below the opening 128 so as to be in contact with a bottom surface of the opening 128.

In the semiconductor device 100 according to the embodiment 1, assuming a portion of the second semiconductor layer 114 sandwiched between the trenches 118 disposed adjacently to each other and deeper than the fourth semiconductor layer 120 as a first column 1C and assuming a portion of the third semiconductor layer 116 deeper than the fourth semiconductor layer 120 as a second column 2C, a super junction structure is formed of the first column 1C and the second column 2C. A charge in the first column 1C and a charge in the second column 2C are balanced.

A thickness of the first semiconductor layer 112 is set to a value which falls within a range of from 100 μm to 400 μm, for example, and a dopant concentration in the first semiconductor layer 112 is set to a value which falls within a range of from $1 \times 10^{-19}$ cm$^{-3}$ to $1 \times 10^{20}$ cm$^{-3}$, for example. A thickness of the second semiconductor layer 114 (a thickness of a region where the trench is not formed) is set to a value which falls within a range of from 5 μm to 120 μm, for example. A depth position of a deepest portion of the fourth semiconductor layer 120 is set to a value which falls within a range of from 0.5 μm to 2.0 μm, for example, and a dopant concentration in the fourth semiconductor layer 120 is set to a value which falls within a range of from $5 \times 10^{16}$ cm$^{-3}$ to $1 \times 10^{18}$ cm$^{-3}$, for example. A dopant concentration in the p$^+$-type high concentration diffusion region 132 is set to a value which falls within a range of from $5 \times 10^{18}$ cm$^{-3}$ to $1 \times 10^{20}$ cm$^{-3}$, for example.

The trenches 118 (the third semiconductor layers 116), the openings 128 and the metal plugs 130 are respectively formed in a stripe shape as viewed in a plan view.

A depth position of a deepest portion of the trench 118 is shallower than a depth position of a boundary surface between the first semiconductor layer 112 and the second semiconductor layer 114. A depth of the trench 118 is set to a value which falls within a range of from 3 μm to 115 μm, for example. A width of the trench 118 is set to a value which falls within a range of from 3 μm to 10 μm, for example. A distance between the trenches 118 disposed adjacently to each other is set substantially equal to or, preferably, equal to a width of the trench 118. A dopant concentration in the second semiconductor layer 114 and a dopant concentration in the third semiconductor layer 116 are respectively set to values which fall within a range of from $5 \times 10^{14}$ cm$^{-3}$ to $5 \times 10^{16}$ cm$^{-3}$, for example.

The interlayer insulation film 122 is formed of a thermal oxide film 121 and a BPSG film. A thickness of the interlayer insulation film 122 is set to 1000 nm, for example.

The openings 128 are disposed at positions avoiding a center portion of the third semiconductor layer 116 as viewed in a plan view, that is, disposed at positions away from the center of the third semiconductor layer 116 by a predetermined distance. As viewed in a plan view, a length from the center of the third semiconductor layer 116 to a side wall of the opening 128 closest to the center of the third semiconductor layer 116 out of side walls of the opening 128 is set to 0.1 μm or more and, for example, is set to 0.3 μm. The openings 128 are formed equidistantly at a predetermined pitch, and a distance between the openings 128 disposed adjacently to each other is set to 0.7 μm, for example. An opening width of the opening 128 is set to 0.5 μm, for example. The openings 128 are formed such that the openings 128 reach a depth position shallower than a depth position of a deepest portion of the fourth semiconductor layer 120.

A surface of the center portion of the third semiconductor layer 116 is covered by the interlayer insulation film 122. Accordingly, the third semiconductor layer 116 is not brought into contact with the second electrode 124 at the center portion of the third semiconductor layer 116. Further, a trench is not formed at the center portion of the third semiconductor layer 116.

A barrier metal (not shown in the drawing) is formed on an inner surface of the opening 128. The metal plug 130 is formed by filling metal in the opening 128 by way of the barrier metal. Metal filled in the opening 128 is tungsten, for example.

The first electrode (cathode electrode) 126 is formed of a multilayer metal film formed of a Ti layer, an Ni layer and an Au layer in this order or the like, and a whole thickness of the first electrode 126 in the form of the multilayer metal film is set to 0.5 μm, for example.

The second electrode 124 is connected to the fourth semiconductor layer 120 formed on the third semiconductor layers 116 via the metal plugs 130. The second electrode (anode electrode) 124 is made of aluminum-based metal (for example, an Al—Cu-based alloy) formed by a sputtering method and having a thickness of 4 μm, for example. The second electrode 124 is also connected to the fourth semiconductor layer 120 formed on the second semiconductor layer 114 via the metal plugs 130.

2. Method of Manufacturing Semiconductor Device According to Embodiment 1

The semiconductor device 100 according to the embodiment 1 can be manufactured by a manufacturing method (method of manufacturing a semiconductor device according to the embodiment 1) which includes the following manufacturing steps.

(1) Semiconductor Base Body Preparing Step

First, the semiconductor base body 110 is prepared where an n$^+$-type second semiconductor layer 114 formed of a monocrystal epitaxial layer is stacked on an n$^+$-type first semiconductor layer 112, a plurality of trenches 118 having a predetermined depth and arranged along a predetermined direction are formed on a surface of the second semiconductor layer 114, and a p$^-$-type third semiconductor layer 116 formed of a monocrystal epitaxial layer is formed in each trench 118.

Figure 2A:
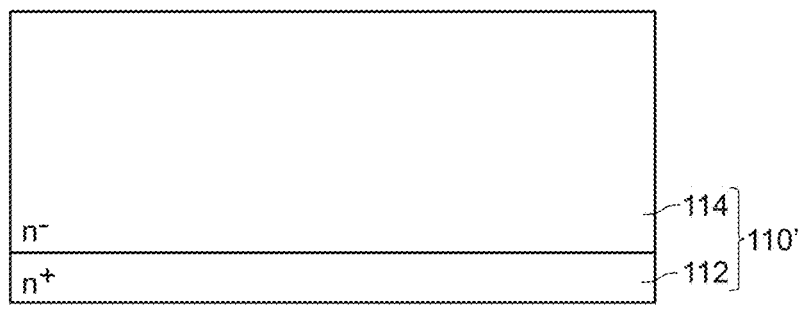

To be more specific, first, a semiconductor base body 110' where the n$^-$-type second semiconductor layer 114 is stacked on the n$^+$-type first semiconductor layer 112 is prepared (see FIG. 2A). As the semiconductor base body 110', a suitable semiconductor base body can be used. For example, a semiconductor base body formed by forming a monocrystal n$^-$-type second semiconductor layer 114 on the n$^+$-type first semiconductor layer 112 by an epitaxial growth method can be used.

Figure 2B:
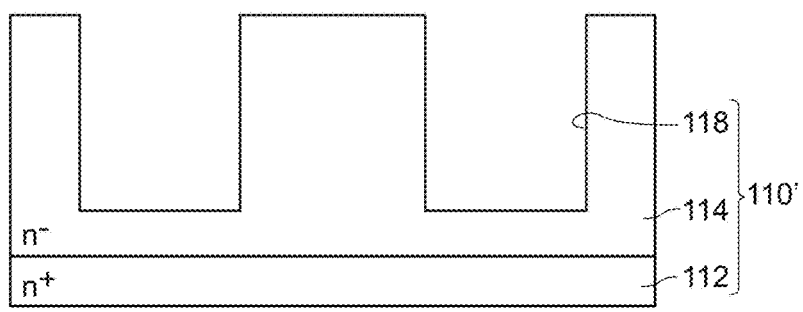

Next, a mask (not shown in the drawing) having openings corresponding to the third semiconductor layers 116 is formed on the surface of the second semiconductor layer 114, and etching is performed using the mask thus forming the plurality of trenches 118 having a predetermined depth arranged along a predetermined direction on the second semiconductor layer 114 (see FIG. 2B).

Figure 2C:
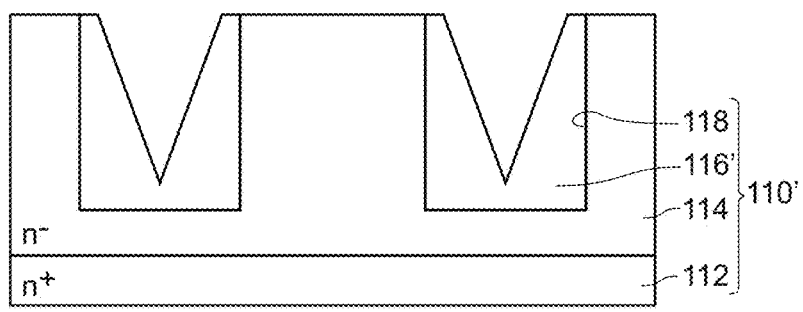
Figure 2D:
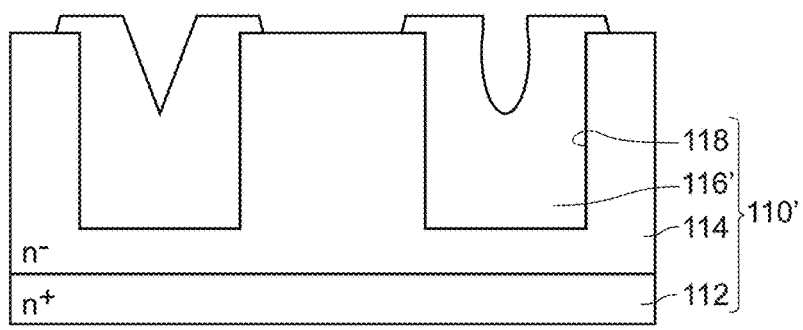
Figure 3A:
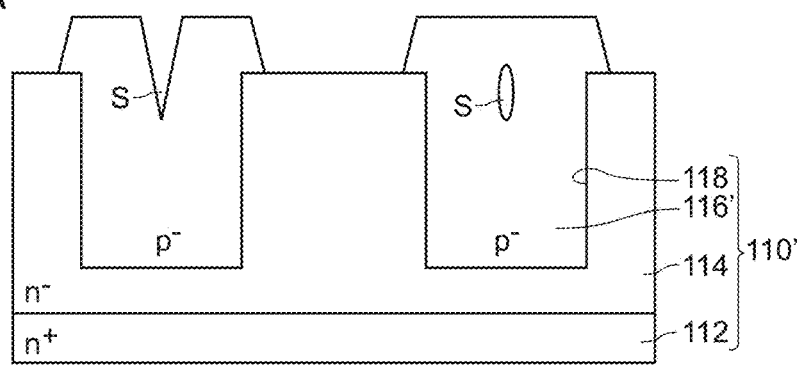

Next, a monocrystal p$^-$-type semiconductor layer 116' is formed in each trench 118 by an epitaxial growth method (see FIG. 2C, FIG. 2D and FIG. 3A). At this stage of operation, however, there may be a case where a cavity S (a slit-like cavity, a crevasse-like cavity, a void-like cavity or the like) remains on a center portion of the semiconductor layer 116' at the center of the semiconductor layer 116' as viewed in a plan view (see symbol S in FIG. 3A). Further, with respect to the shape of the cavity, besides the case where the cavity is formed continuously (see FIG. 1B), there may be a case where the cavity is formed discontinuously or a case where the cavity is formed only at one place in an independent manner. Further, in the embodiment 1, a depth of the cavity S is shallower than a depth of the fourth semiconductor layer 120. However, the present invention is also applicable to a case where the depth of the cavity S is deeper than the depth of the fourth semiconductor layer 120.

Figure 3B:
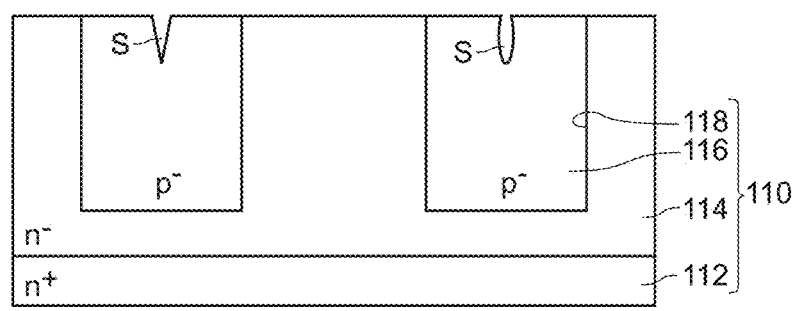

Next, a p⁻-type third semiconductor layer 116 is formed by removing the semiconductor layer 116' by a CMP method except for the inside of the trench 118 (see FIG. 3B). At this stage of operation, there may be a case where the cavity S remains at the center portion of the third semiconductor layer 116 as viewed in a plan view.

(2) Fourth Semiconductor Layer Forming Step

Figure 3C:
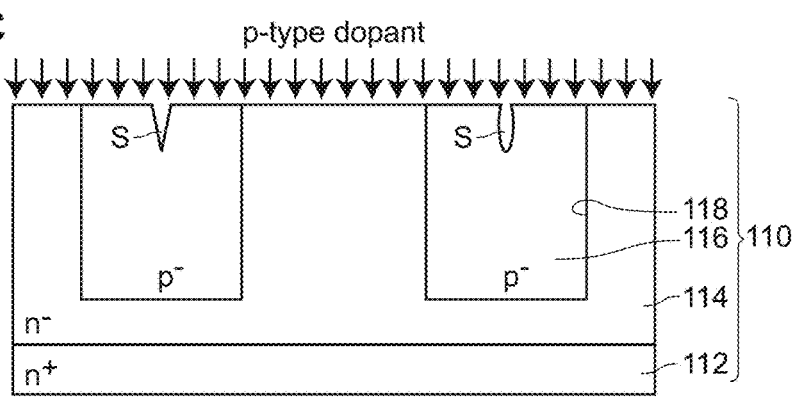

Next, a thermal oxide film (not shown in the drawing) is formed on the whole surface of the second semiconductor layer 114 and the whole surfaces of the third semiconductor layers 116. Subsequently, a p-type dopant (for example, boron) is injected into the surface of the second semiconductor layer 114 and the surfaces of the third semiconductor layers 116 by ion-implantation through the thermal oxide film (see FIG. 3C). Next, the fourth semiconductor layer 120 is formed on the whole surface of the second semiconductor layer 114 and the whole surfaces of the third semiconductor layers 116 by thermally diffusing the p-type dopant.

(3) Interlayer Insulation Film Forming Step

Figure 3D:
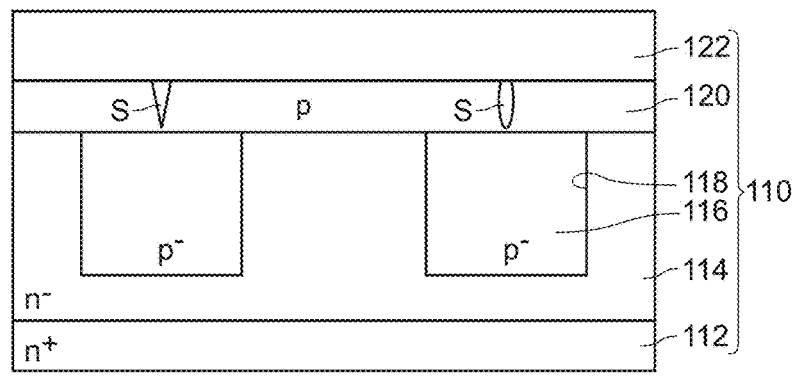

Next, by forming a BPSG film on the above-mentioned thermal oxide film by a CVD method, the interlayer insulation film 122 which is formed of the thermal oxide film (not shown in the drawing) and the BPSG film is formed on the surface of the second semiconductor layer 114 and the surfaces of the third semiconductor layers 116 (the whole surface of the second semiconductor layer 114 and the whole surfaces of the third semiconductor layers 116) (see FIG. 3D).

(4) Opening Forming Step

Figure 4A:
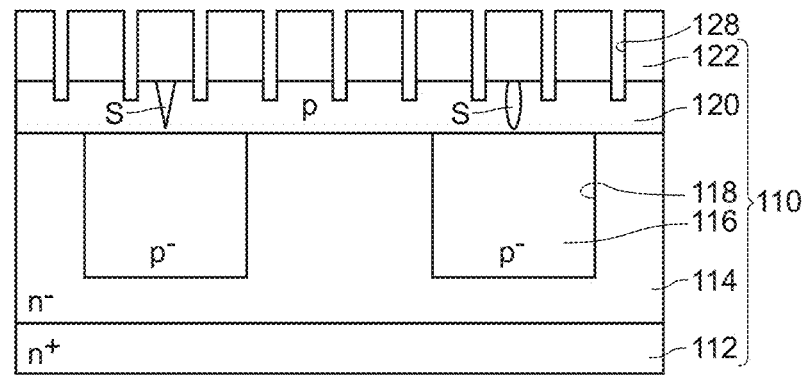

Next, a mask (not shown in the drawing) having openings within regions where the second semiconductor layer 114 and the third semiconductor layers 116 are formed as viewed in a plan view is formed on the interlayer insulation film 122. In this case, within a region where the third semiconductor layer 116 is formed as viewed in a plan view, the openings are formed in the mask at positions avoiding the center portion of each third semiconductor layer 116 as viewed in a plan view. Next, by performing etching using the mask, predetermined openings are formed in the interlayer insulation film within the regions where the second semiconductor layer 114 and the third semiconductor layers 116 are formed as viewed in a plan view (see FIG. 4A). At this stage of operation, within each region where the third semiconductor layer 116 is formed as viewed in a plan view, the predetermined openings are formed at positions avoiding the center portion of the third semiconductor layer 116 as viewed in a plan view. Accordingly, a surface of the center portion of the third semiconductor layer 116 is covered by the interlayer insulation film 122.

(5) p-Type High Concentration Diffusion Region Forming Step

Figure 4B:
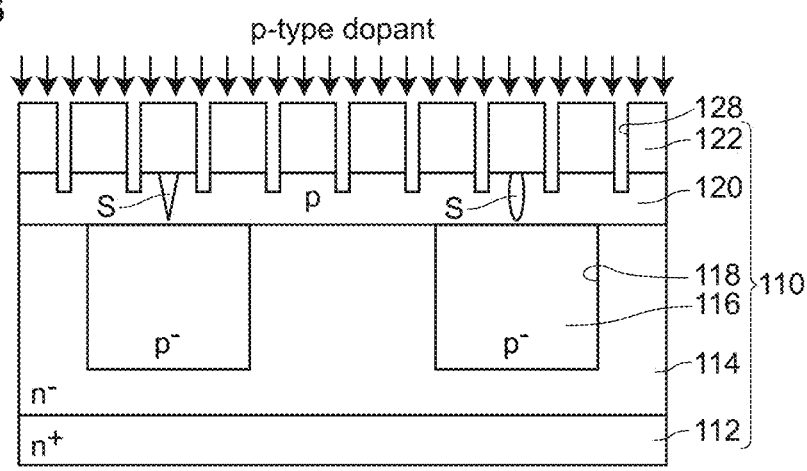
Figure 4C:
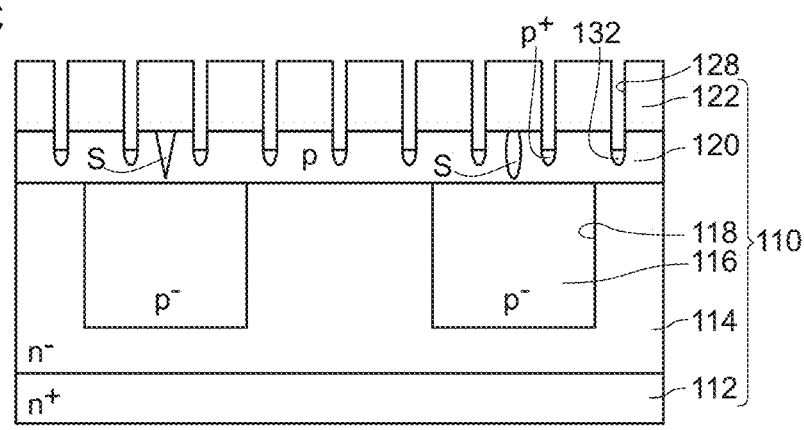

Next, a p-type dopant (for example, boron) is injected into bottom surfaces of the openings 128 by ion implantation with a higher dopant concentration than the fourth semiconductor layer 120 (see FIG. 4B). Subsequently, by thermally diffusing the p-type dopant, a p-type high concentration diffusion region 132 having higher dopant concentration than the fourth semiconductor layer 120 is formed directly below each opening so as to be in contact with the bottom surface of the opening 128 (see FIG. 4C).

(6) Metal Plug 130 Forming Step

Figure 5A:
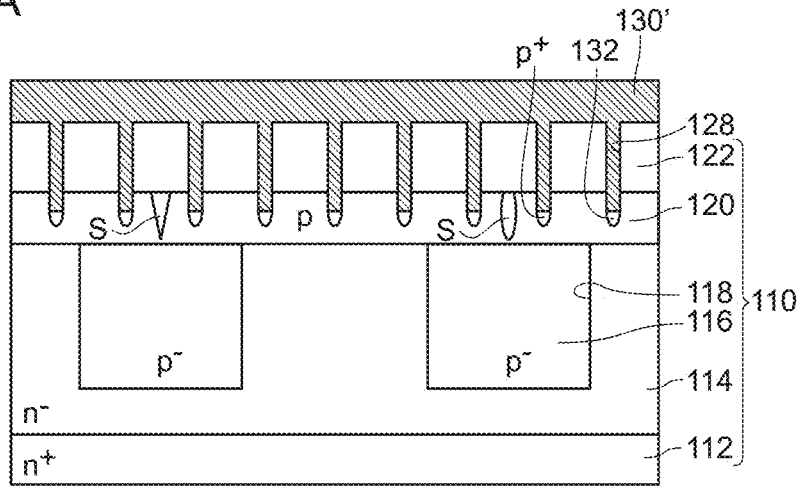
Figure 5B:
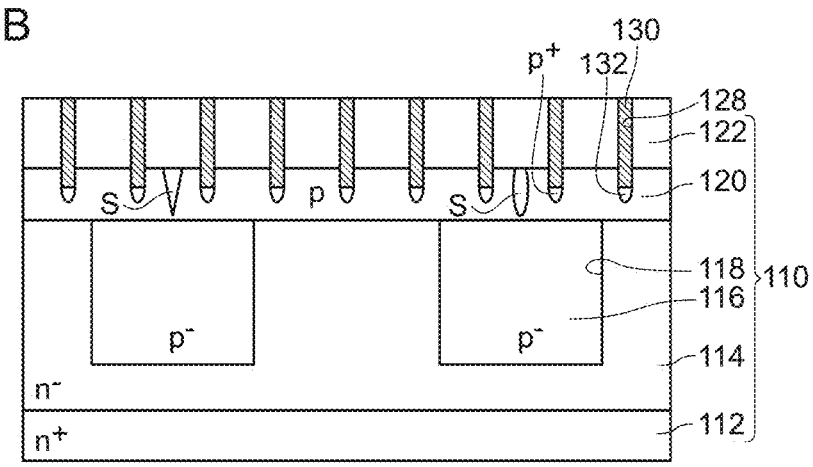

Next, the metal plugs 130 are formed by filling the inside of the openings 128 with metal which differs from metal for forming the second electrode 124. To be more specific, first, a barrier metal (not shown in the drawing) is formed as a film on an inner peripheral surface of each opening 128 by a sputtering method, and the barrier metal is annealed. Next, a film made of tungsten is formed on the barrier metal by a CVD method (see FIG. 5A). Subsequently, by removing tungsten on the interlayer insulation film 122 by a CMP method, tungsten remains only in the inside of the openings 128 thus forming the metal plugs 130 (see FIG. 5B). As a composition of the barrier metal, titanium nitride (TiN), titanium tungsten (TiW), molybdenum silicon (MoSi) or the like can be used. Also in the step of forming the metal plugs 130, the surface of the center portion of the third semiconductor layer 116 is covered by the interlayer insulation film 122.

(7) Electrode Forming Step

Figure 5C:
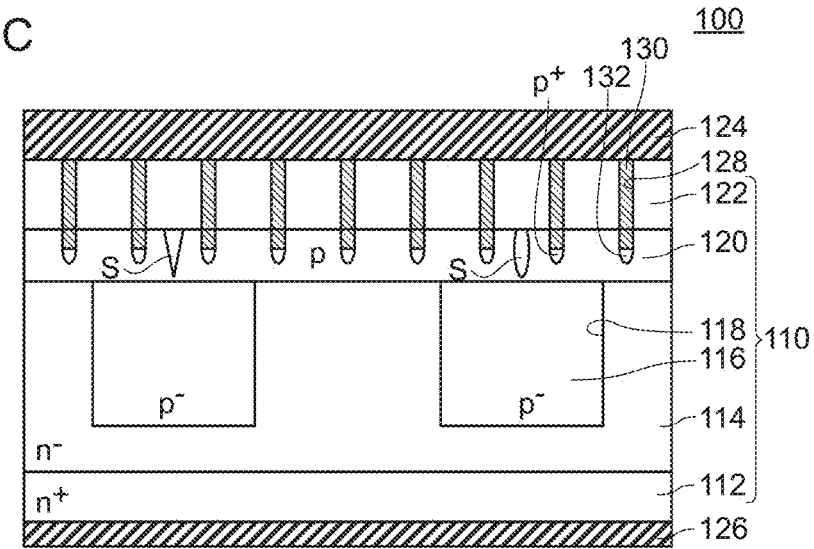

Next, a multilayer metal film formed of a Ti layer, an Ni layer and an Au layer or the like is formed on the surface of the first semiconductor layer 112 thus forming the first electrode (cathode electrode) 126. On the other hand, a film formed of an Al—Cu-based alloy is formed on the third semiconductor layers 116 and the interlayer insulation film 122 by a sputtering method thus forming the second electrode 124 which is connected to the third semiconductor layer 116 via the metal plugs 130 on the interlayer insulation film 122 (see FIG. 5C). Also in the electrode forming step, the surface of the center portion of the third semiconductor layer 116 is covered by the interlayer insulation film 122 as it is and hence, there is no possibility that metal for forming the second electrode 124 enters the cavity S.

In this manner, the semiconductor device 100 according to the embodiment 1 can be manufactured.

3. Advantages Acquired by the Semiconductor Device 100 and Method of Manufacturing a Semiconductor Device According to Embodiment 1

Figure 6A:
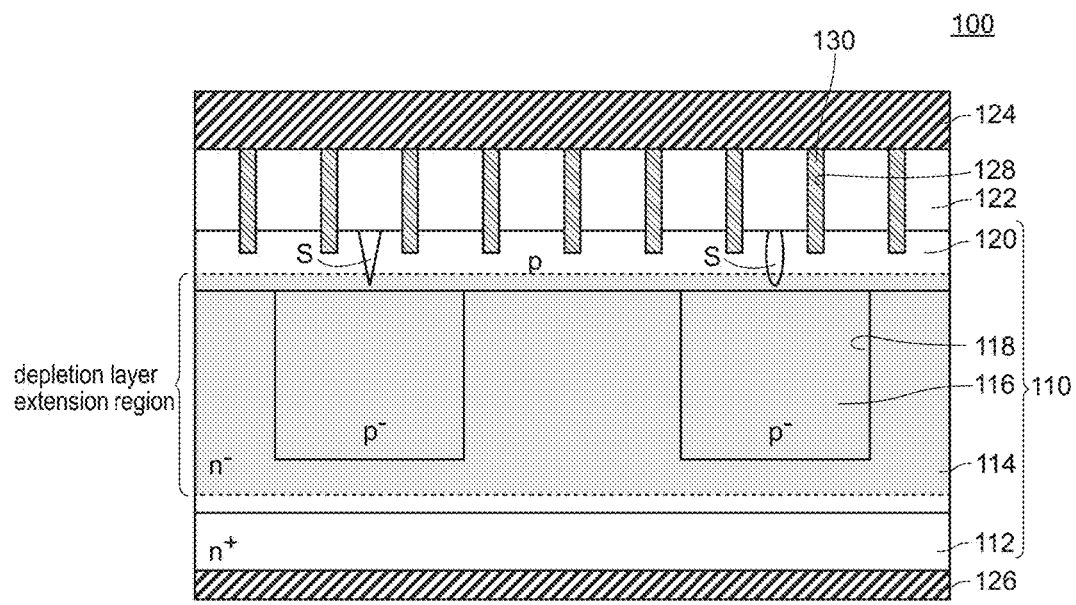
Figure 6B:
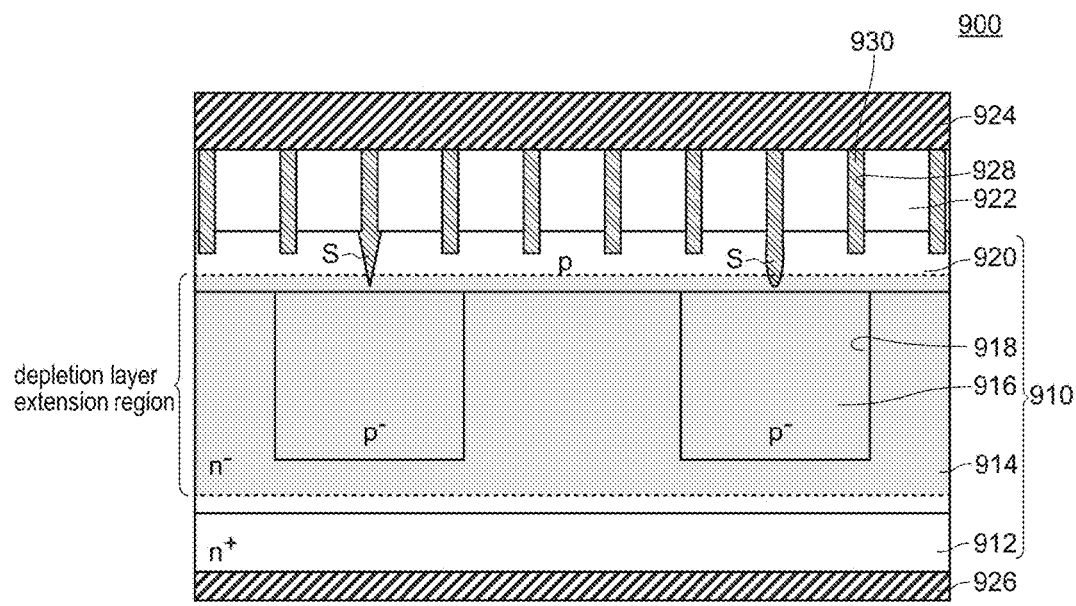

In a semiconductor device (a semiconductor device 900 according to a comparison example, see FIG. 6B) where an opening 928 (and metal plugs 930) is positioned at a center portion of a third semiconductor layer 916 as viewed in a plan view, substantially in the same manner as the conventional MOSFET 700, in establishing contact between the third semiconductor layers 916 and a second electrode 924, metal for forming the second electrode 924 enters the inside of a cavity S so that metal in the cavity S becomes an electrode potential. Accordingly, when a negative potential is applied to the second electrode 924, a depletion layer extending toward a second electrode 924 side from a pn junction surface between the second semiconductor layer 914 and the third semiconductor layer 916 is brought into contact with the metal in the cavity S so that breakdown in a reach through mode is liable to occur whereby a breakdown strength is liable to be lowered.

To cope with such a drawback, according to the semiconductor device 100 of the embodiment 1, the opening 128 is disposed at the position avoiding the center portion of the third semiconductor layer 116 as viewed in a plan view, and the surface of the center portion of the third semiconductor layer 116 is covered by the interlayer insulation film 122. Accordingly, in forming the third semiconductor layer 116, even when a cavity S remains in the third semiconductor layer 116 at the center of the third semiconductor layer 116 as viewed in a plan view, in establishing contact between the third semiconductor layer 116 and the second electrode 124, there is no possibility that metal for forming the second electrode 124 enters the inside of the cavity S and hence, there is no possibility that metal in the inside of the cavity S becomes an electrode potential. Accordingly, even when a negative potential is applied to the second electrode 124, there arises only a phenomenon where a depletion layer extending toward a second electrode 124 side from a pn junction surface between the second semiconductor layer 114 and the third semiconductor layer 116 is brought into contact with the above-mentioned cavity S. Accordingly, it is possible to provide a semiconductor device where breakdown in a reach through mode minimally occurs so that lowering of a breakdown strength is minimized (see FIG. 6A).

A silicon surface in the inside of the cavity S is stabilized by being oxidized in an oxidization step which is a semiconductor preliminary step (for example, a step of forming a thermal oxide film in the fourth semiconductor layer forming step) or by terminating by hydrogen a dangling bond in an annealing step (for example, the fourth semiconductor layer forming step and a p-type high concentration diffusion region forming step) so that even when a depletion layer reaches the cavity, there arises only a phenomenon where the depletion layer is brought into contact with the above-mentioned cavity. Accordingly, there is no possibility that a leak current is suddenly increased or a breakdown occurs.

Further, according to the semiconductor device 100 of the embodiment 1, the semiconductor device 100 includes the interlayer insulation film 122 having the predetermined opening formed within the region where the third semiconductor layer 116 is formed as viewed in a plan view. Accordingly, in avalanche breakdown or during reverse recovery of a body diode, holes generated in the third semiconductor layer 116 can be easily extracted. As a result, an L-load avalanche breakdown resistance can be increased.

According to the semiconductor device 100 of the embodiment 1, a length from a center of the third semiconductor layer 116 to a side wall of the opening 128 closest to the center of the third semiconductor layer 116 out of side walls of the opening 128 is set to 0.1 µm or more as viewed in a plan view. Accordingly, it is possible to prevent the opening 128 (and the metal plug 130) from communicating with the cavity S thus preventing with certainty metal for forming the metal plug 130 from entering the cavity S. As a result, it is possible to provide a semiconductor device where breakdown in a reach through mode further minimally occurs so that lowering of a breakdown strength is further minimized. In this respect, it is preferable that a length from a center of the third semiconductor layer 116 to the side wall of the opening 128 closest to the center of the third semiconductor layer 116 out of the side walls of the opening 128 be set to 0.2 µm or more as viewed in a plan view.

According to the semiconductor device 100 of the embodiment 1, the semiconductor device 100 further includes a metal plug 130 which is formed by filling the inside of the opening 128 with metal which differs from metal for forming the second electrode 124, and the second electrode 124 is connected to the third semiconductor layer 116 through the metal plug 130. Accordingly, an opening width of the opening 128 may be relatively small thus providing a miniaturized semiconductor device. As a result, it is possible to provide a semiconductor device which can satisfy a demand for the reduction in cost and the downsizing of electronic equipment.

According to the semiconductor device 100 of the embodiment 1, assuming a portion of the second semiconductor layer 114 sandwiched between the trenches 118 disposed adjacently to each other and being deeper than the fourth semiconductor layer 120 as a first column 1C and assuming a portion of the third semiconductor layer 116 deeper than the fourth semiconductor layer 120 as a second column 2C, a super junction structure is formed of the first column 1C and the second column 2C. Accordingly, it is possible to provide a semiconductor device having a high breakdown strength.

According to the semiconductor device 100 of the embodiment 1, a p-type high concentration diffusion region 132 having higher dopant concentration than the fourth semiconductor layer 120 is formed right below the opening 128 so as to be in contact with a bottom surface of the opening 128. Accordingly, in avalanche breakdown or during reverse recovery of a diode, holes generated can be easily extracted.

According to the semiconductor device 100 of the embodiment 1, the second semiconductor layer 114 is formed of a monocrystal epitaxial layer and hence, conductivity of the second semiconductor layer 114 can be controlled with high accuracy. Further, oxygen is minimally taken in the semiconductor base body during the manufacturing steps of the semiconductor device and hence, a crystal defect minimally occurs so that an electric defect minimally occurs in a semiconductor device.

According to the method of manufacturing a semiconductor device of the embodiment 1, the method includes the opening forming step of forming the predetermined opening 128 in the interlayer insulation film 122 at the position avoiding the center portion of the third semiconductor layer 116 as viewed in a plan view, and the surface of the center portion of the third semiconductor layer 116 is covered by the interlayer insulation film 122 in the electrode forming step. Accordingly, in forming the third semiconductor layer 116, even when a cavity S having a slit shape, a crevasse shape or a void shape remains in the third semiconductor layer 116 at the center of the third semiconductor layer 116 as viewed in a plan view, in establishing contact between the third semiconductor layer 116 and the second electrode 124 in the electrode forming step, there is no possibility that metal for forming the second electrode 124 enters the inside of the cavity S and hence, there is no possibility that metal in the inside of the cavity S becomes an electrode potential. Accordingly, in the manufactured semiconductor device, even when a negative potential is applied to the second electrode 124, there arises only a phenomenon where a depletion layer extending toward a second electrode 124 side from a pn junction surface between the second semiconductor layer 114 and the third semiconductor layer 116 is brought into contact with the cavity S. Accordingly, it is possible to manufacture a semiconductor device where breakdown in a reach through mode minimally occurs so that lowering of a breakdown strength is minimized.

Further, according to the method of manufacturing a semiconductor device of the embodiment 1, the method includes the opening forming step of forming the predetermined opening in the interlayer insulation film 122 within the region where at least the third semiconductor layer 116 is formed as viewed in a plan view. Accordingly, in the manufactured semiconductor device, in avalanche breakdown or during reverse recovery of a body diode, holes generated in the third semiconductor layer 116 can be easily extracted. As a result, it is possible to manufacture a semiconductor device having a large L-load avalanche breakdown resistance.

Embodiment 2

Figure 7:
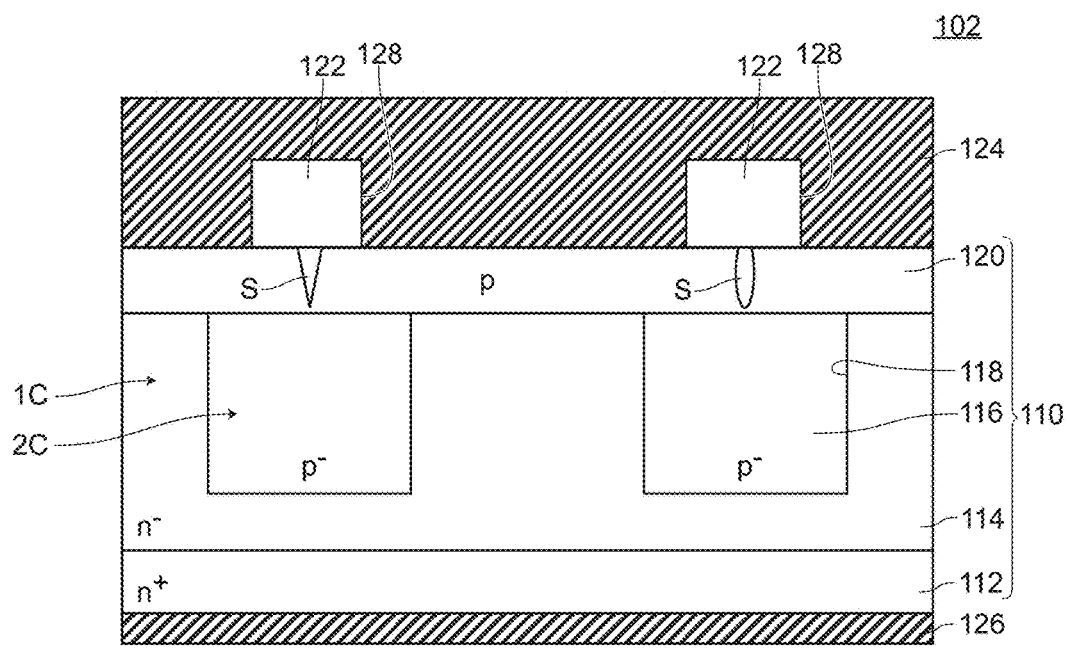
FIG. 7 is an enlarged cross-sectional view showing a main part of a semiconductor device 102 according to an embodiment 2.

A semiconductor device 102 according to an embodiment 2 basically has substantially the same configuration as the semiconductor device 100 according to the embodiment 1. However, the semiconductor device 102 according to the embodiment 2 differs from the semiconductor device 100 according to the embodiment 1 with respect to a point that a second electrode is directly connected to third semiconductor layers. That is, in the semiconductor device 102 according to the embodiment 2, as shown in FIG. 7, metal for forming a second electrode 124 is directly filled in openings 128, and the second electrode 124 is directly connected to a fourth semiconductor layer 120. Here, a barrier metal (not shown in the drawing) may be formed on an inner surface of each opening 128.

The openings 128 are formed over the whole region except for the center portions of the third semiconductor layers as viewed in a plan view.

The method of manufacturing a semiconductor device according to the embodiment 2 basically has substantially the same configuration as the method of manufacturing a semiconductor device according to the embodiment 1. However, the method of manufacturing a semiconductor device according to the embodiment 2 differs from the method of manufacturing a semiconductor device according to the embodiment 1 with respect to a point that the method of manufacturing a semiconductor device according to the embodiment 2 does not include the metal plug forming step. That is, in the method of manufacturing a semiconductor device according to the embodiment 2, the method does not include the metal plug forming step, and includes, in the electrode forming step, a step of forming the second electrode 124 on the interlayer insulation film 122 where metal for forming the second electrode 124 is filled in the opening 128 directly, and the second electrode 124 is directly connected to the fourth semiconductor layer 120.

In this manner, the semiconductor device 102 according to the embodiment 2 differs from the semiconductor device 100 according to the embodiment 1 with respect to a point that the second electrode is directly connected to the third semiconductor layers. However, in the same manner as the semiconductor device 100 according to the embodiment 1, the openings 128 are disposed at positions avoiding the center portions of the third semiconductor layers 116 as viewed in a plan view, and surfaces of the center portions of the third semiconductor layers 116 are covered by the interlayer insulation film 122. Accordingly, in forming the third semiconductor layer 116, even when the cavity S remains in each third semiconductor layer 116 at the center of the third semiconductor layer 116 as viewed in a plan view, in establishing the contact between the third semiconductor layer 116 and the second electrode 124, there is no possibility that metal for forming the second electrode 124 enters the cavity S and hence, there is no possibility that the metal in the inside of the cavity S becomes an electrode potential. Accordingly, even when a negative potential is applied to the second electrode 124, there arises only a phenomenon where the depletion layer extending toward the second electrode 124 side from the pn junction surface between the second semiconductor layer 114 and the third semiconductor layer 116 is brought into contact with the cavity S. Accordingly, it is possible to provide a semiconductor device where breakdown in a reach through mode minimally occurs so that lowering of a breakdown strength is minimized.

Further, in the semiconductor device 102 according to the embodiment 2, metal for forming the second electrode 124 is directly filled in the openings 128, and the second electrode 124 is directly connected to the fourth semiconductor layer 120 and hence, a contact area between the second electrode 124 and the fourth semiconductor layer 120 can be increased so that a large current can be made to flow between the second electrode 124 and the fourth semiconductor layer 120.

The method of manufacturing a semiconductor device according to the embodiment 2 dose not include the metal plug forming step and hence, the contact between the second electrode 124 and the fourth semiconductor layer 120 can be relatively easily established.

The semiconductor device 102 according to the embodiment 2 has substantially the same configuration as the semiconductor device 100 according to the embodiment 1 except for the point that the second electrode is directly connected to the third semiconductor layer. Accordingly, the semiconductor device 102 according to the embodiment 2 can acquire advantageous effects which correspond to advantageous effects out of advantageous effects which the semiconductor device 100 according to the embodiment 1 can acquire.

Embodiment 3

Figure 8:
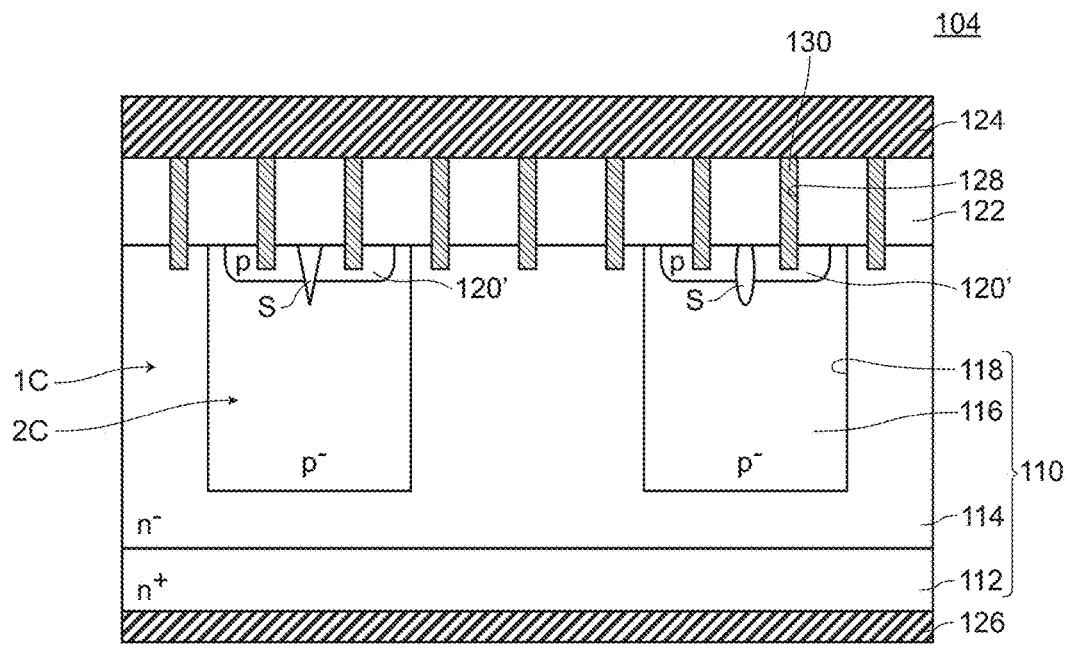
FIG. 8 is an enlarged cross-sectional view showing a main part of a semiconductor device 104 according to an embodiment 3.

A semiconductor device 104 according to an embodiment 3 basically has substantially the same configuration as the semiconductor device 100 according to the embodiment 1. However, the semiconductor device 104 according to the embodiment 3 differs from the semiconductor device 100 according to the embodiment 1 with respect to a point that the semiconductor device 104 is a schottky barrier diode in place of a PIN diode. That is, as shown in FIG. 8, in the semiconductor device 104 according to the embodiment 3, metal plugs 130 are respectively made of barrier metal, and a second electrode 124 is a schottky barrier diode which is connected also to a second semiconductor layer 114 in addition to third semiconductor layers 116. In the third embodiment, unlike the embodiment 1, a $p^+$-type high concentration diffusion region 132 is not formed. Further, on a surface of each third semiconductor layer 116, a p-type diffusion region 120' is formed.

In the semiconductor device 104 according to the embodiment 3, assuming a portion of the second semiconductor layer 114 sandwiched between the trenches 118 disposed adjacently to each other as a first column 1C and assuming the third semiconductor layers 116 as second columns 2C, a super junction structure is formed of the first column 1C and the second columns 2C.

In this manner, the semiconductor device 104 according to the embodiment 3 differs from the semiconductor device 100 according to the embodiment 1 with respect to a point that the semiconductor device 104 is a schottky barrier diode in place of a PIN diode. However, in the same manner as the semiconductor device 100 according to the embodiment 1, the openings 128 are disposed at positions avoiding center portions of the third semiconductor layers 116 as viewed in a plan view, and surfaces of the center portions of the third semiconductor layers 116 are covered by the interlayer insulation film 122. Accordingly, in forming the third semiconductor layer 116, even when a cavity S having a slit shape, a crevasse shape or a void shape remains in the third semiconductor layer 116 at the center of the semiconductor layer 116 as viewed in a plan view, in establishing the contact between the third semiconductor layer 116 and the second electrode 124, there is no possibility that barrier metal for forming the metal plug 130 enters the inside of the cavity S and hence, there is no possibility that the metal in the inside of the cavity S becomes an electrode potential. Accordingly, even when a negative potential is applied to the second electrode 124, there arises only a phenomenon where the depletion layer extending toward the second electrode 124 side from the pn junction surface between the second semiconductor layer 114 and the third semiconductor layer 116 is brought into contact with the cavity S. Accordingly, it is possible to provide a semiconductor device where breakdown in a reach through mode minimally occurs so that lowering of a breakdown strength is minimized.

In the semiconductor device 104 according to the embodiment 3, assuming a portion of the second semiconductor layer 114 sandwiched between the trenches 118 disposed adjacently to each other as a first column 1C and assuming the third semiconductor layers 116 as second columns 2C, the super junction structure is formed of the first column 1C and the second columns 2C. Accordingly, it is possible to provide a semiconductor device having a high breakdown strength.

The semiconductor device 104 according to the embodiment 3 has substantially the same configuration as the semiconductor device 100 according to the embodiment 1 except for a point that the semiconductor device 104 is a schottky barrier diode in place of a PIN diode. Accordingly, the semiconductor device 104 of the embodiment 3 can acquire advantageous effects which correspond to advantageous effects out of advantageous effects which the semiconductor device 100 according to the embodiment 1 can acquire.

Embodiment 4

Figure 9A:
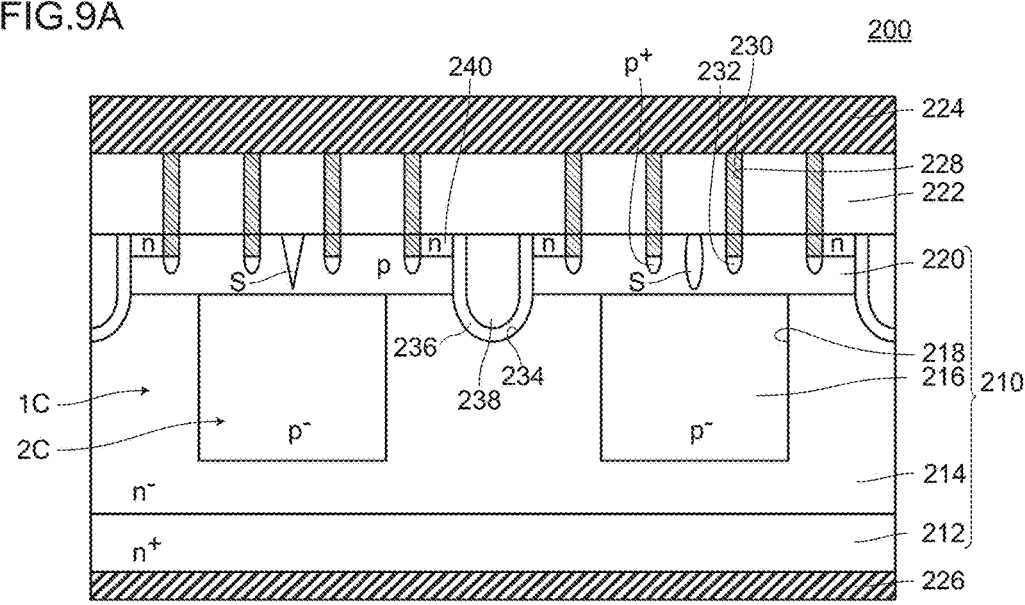
Figure 9B:
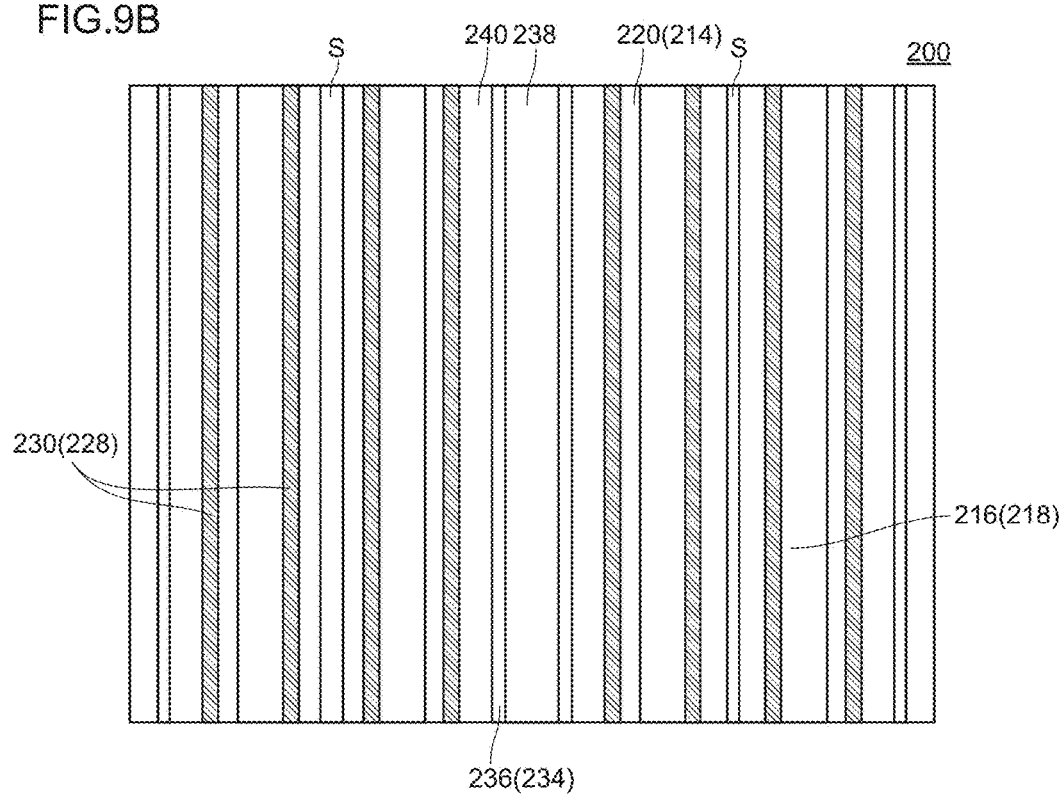

A semiconductor device 200 according to an embodiment 4 basically has substantially the same configuration as the semiconductor device 100 according to the embodiment 1. However, the semiconductor device 200 according to the embodiment 4 differs from the semiconductor device 100 according to the embodiment 1 with respect to a point that the semiconductor device 200 is a MOSFET in place of the diode. That is, as shown in FIG. 9, the semiconductor device 200 according to the embodiment 4 is configured such that, in a semiconductor base body 210, a first semiconductor layer 212 is an n$^+$-type semiconductor layer, a fourth semiconductor layer 220 is a base layer formed on the whole surfaces of a second semiconductor layer 214 and third semiconductor layers 216, high concentration diffusion regions of a first conductive type 240 (source regions 240) are formed on a surface of the fourth semiconductor layer 220, and the semiconductor device 200 is a trench gate type MOSFET which includes: gate trenches 234 each of which is positioned in a region where the trench 218 is not formed as viewed in a plan view, and is formed such that the gate trench 234 reaches a depth position deeper than a deepest portion of the fourth semiconductor layer 220 and a portion of the source region 240 is exposed on an inner peripheral surface the gate trench 234; gate insulation films 236 each of which is formed on the inner peripheral surface of the gate trench 234; and gate electrodes 238 each of which is formed such that the gate electrode 238 is embedded in the inside of the gate trench 234 with a gate insulation film 236 interposed between the gate electrode 238 and the gate trench 234. A second electrode 224 is connected to the fourth semiconductor layer 220 and the source regions 240.

The gate trench 234, the gate electrode 238, and the source region 240 are respectively formed in a stripe shape as viewed in a plan view.

The source region 240 is formed between two gate trenches 234 disposed adjacently to each other and also only between the gate trench 234 and the metal plug 230 disposed closest to the gate trench 234. A depth position of the deepest portion of the source region 240 is set to a value which falls within a range of from 0.1 μm to 0.4 μm, for example, and a dopant concentration in the source region 240 is set to a value which falls within a range of from $5\times10^{19}$ cm$^{-3}$ to $2\times10^{20}$ cm$^{-3}$, for example.

A depth of the gate trench 234 is set to 3 μm, for example. The gate insulation film 236 is formed of a silicon dioxide film formed by a thermal oxidation method, and has a thickness of 10 nm, for example. The gate electrode 238 is made of low-resistance polysilicon formed by a CVD method and an ion injection method.

The opening 228 and the metal plug 230 are formed such that the opening 228 and the metal plug 230 reach a depth position deeper than a bottom portion of the source region 240.

In the embodiment 4, between the gate trenches 234 disposed adjacently to each other, the metal plugs 230 are formed equidistantly, and the even number of metal plugs 230 (in the embodiment 4, two metal plugs 230) are formed for each region where the trench 218 is formed as viewed in a plan view. With such a configuration, an opening (metal plug 230) can be formed at a position avoiding a center portion of the third semiconductor layer 216 without paying particular attention and hence, designing of the semiconductor device can be facilitated.

In this manner, the semiconductor device 200 according to the embodiment 4 differs from the semiconductor device 100 according to the embodiment 1 with respect to a point that the semiconductor device 200 is the MOSFET in place of the diode. However, in the same manner as the semiconductor device 100 according to the embodiment 1, the opening 228 is disposed at a position avoiding a center portion of the third semiconductor layer 216 as viewed in a plan view, and a surface of the center portion of the third semiconductor layer 116 is covered by the interlayer insulation film 122 and hence, in forming the third semiconductor layer 216, even when a cavity S having a slit shape, a crevasse shape or a void shape remains in the third semiconductor layer 216 at the center of the third semiconductor layer 216 as viewed in a plan view, in establishing contact between the third semiconductor layer 216 and the second electrode 224, there is no possibility that metal for forming the metal plug 230 enters the inside of the cavity S and hence, there is no possibility that metal in the inside of the cavity S becomes an electrode potential. Accordingly, even when a negative potential is applied to the second electrode 224, there arises only a phenomenon where a depletion layer extending toward a second electrode 224 side from a pn junction surface between the second semiconductor layer 214 and the third semiconductor layer 216 is brought into contact with the above-mentioned cavity S. Accordingly, it is possible to provide a semiconductor device where breakdown in a reach through mode minimally occurs so that lowering of a breakdown strength is minimized.

The semiconductor device 200 according to the embodiment 4 has substantially the same configuration as the semiconductor device 100 according to the embodiment 1 except for a point that the semiconductor device 200 is the MOSFET in place of the diode. Accordingly, the semiconductor device 200 according to the embodiment 4 can acquire advantageous effects which correspond to advantageous effects out of advantageous effects which the semiconductor device 100 according to the embodiment 1 can acquire.

Embodiment 5

Figure 10:
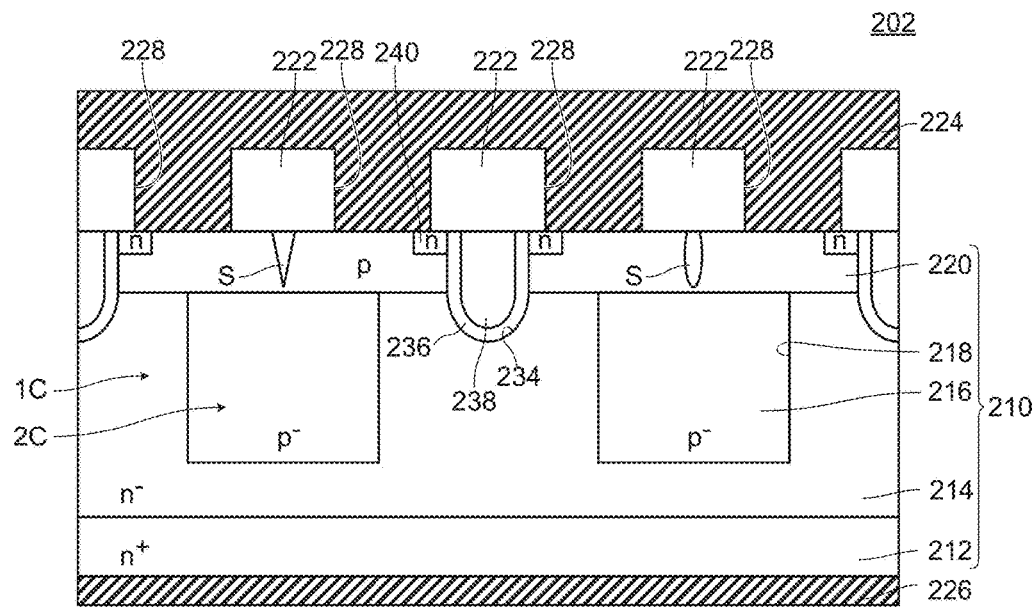
FIG. 10 is an enlarged cross-sectional view showing a main part of a semiconductor device 202 according to an embodiment 5.

A semiconductor device 202 according to an embodiment 5 basically has substantially the same configuration as the semiconductor device 200 according to the embodiment 4. However, the semiconductor device 202 according to the embodiment 5 differs from the semiconductor device 200 according to the embodiment 4 with respect to a point that a second electrode is directly connected to a third semiconductor layer. That is, in the semiconductor device 202 according to the embodiment 5, as shown in FIG. 10, metal for forming the second electrode 224 is directly filled in openings 228, and the second electrode 224 is directly connected to a fourth semiconductor layer 220 which is formed on a surface of a second semiconductor layer 214 and source regions 240.

The openings 128 are formed in regions except for the center portions of the third semiconductor layers 216 and regions where the gate electrodes 238 are formed as viewed in a plan view.

As described above, the semiconductor device 202 according to the embodiment 5 differs from the semiconductor device 200 according to the embodiment 4 with respect to a point that the second electrode is directly connected to the third semiconductor layers. However, in the same manner as the semiconductor device 200 according to the embodiment 4, the opening 228 is disposed at a position avoiding a center portion of the third semiconductor layer 216 as viewed in a plan view, and a surface of the center portion of the third semiconductor layer 216 is covered by the interlayer insulation film 222 and hence, in establishing the contact between the third semiconductor layer 216 and the second electrode 224, there is no possibility that metal for forming the second electrode 224 enters the cavity S which may be formed in the inside of the third semiconductor layer 216 and hence, there is no possibility that metal in the inside of the cavity S becomes an electrode potential. Accordingly, even when a negative potential is applied to the second electrode 224, there arises only a phenomenon where a depletion layer extending toward a second electrode 224 side from a pn junction surface between the second semiconductor layer 214 and the third semiconductor layer 216 is brought into contact with the above-mentioned cavity S. Accordingly, it is possible to provide a semiconductor device where breakdown in a reach through mode minimally occurs so that lowering of a breakdown strength is minimized compared to the conventional MOSFET 700.

According to the semiconductor device 202 of the embodiment 5, metal for forming the second electrode 224 is directly filled in the opening 228, and the second electrode 224 is directly connected to the fourth semiconductor layer 220 and the source region 240 and hence, a contact area between the second electrode 224 and the fourth semiconductor layer 220 and a contact area between the second electrode 224 and the source region 240 can be increased whereby a large current can be made to flow between the second electrode 224 and the fourth semiconductor layer 220 and between the second electrode 224 and the source region 240.

The method of manufacturing a semiconductor device according to the embodiment 5 does not include the metal plug forming step and hence, the contact between the second electrode 224 and the fourth semiconductor layer 220 and between the second electrode 224 and the source region 240 can be relatively easily established.

The semiconductor device 202 according to the embodiment 5 has substantially the same configuration as the semiconductor device 200 according to the embodiment 4 except for a configuration of the opening and metal which is filled in the opening. Accordingly, the semiconductor device 202 according to the embodiment 5 can acquire advantageous effects which correspond to advantageous effects out of advantageous effects which the semiconductor device 200 according to the embodiment 4 can acquire.

Embodiment 6

Figure 11:
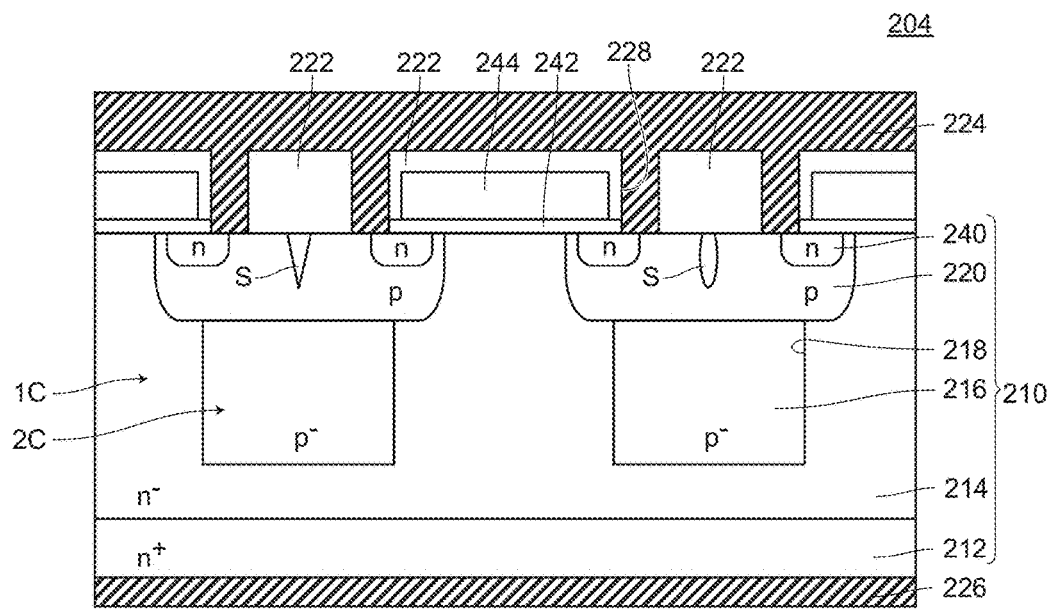
FIG. 11 is an enlarged cross-sectional view showing a main part of a semiconductor device 204 according to an embodiment 6.

A semiconductor device 204 according to an embodiment 6 basically has substantially the same configuration as the semiconductor device 202 according to the embodiment 5. However, the semiconductor device 204 according to the embodiment 6 differs from the semiconductor device 202 according to the embodiment 5 with respect to a point that the semiconductor device 204 is a planar gate MOSFET in place of the trench gate MOSFET. That is, as shown in FIG. 11, the semiconductor device 204 according to the embodiment 6 is configured such that, in a semiconductor base body 210, a first semiconductor layer 212 is an n$^+$-type semiconductor layer, a fourth semiconductor layer 220 is a base layer which is formed on portions of a surface of the second semiconductor layer 214 and the whole surfaces of the third semiconductor layers 216, and source regions 240 (high concentration diffusion regions of a first conductive type) are formed on portions of a surface of the fourth semiconductor layer 220, wherein the semiconductor device 204 is a planar gate type MOSFET which further includes gate electrodes 244 each of which is formed so as to cover at least the fourth semiconductor layer 220 sandwiched between the source region 240 and the second semiconductor layer 214 by way of a gate insulation film 242.

In this manner, the semiconductor device 204 according to the embodiment 6 differs from the semiconductor device 202 according to the embodiment 5 with respect to a point that the semiconductor device 204 is the planar gate MOSFET in place of the trench gate MOSFET. However, in the same manner as the semiconductor device 202 according to the embodiment 5, the opening 228 is disposed at a position avoiding a center portion of the third semiconductor layer 216 as viewed in a plan view, and a surface of the center portion of the third semiconductor layer 216 is covered by the interlayer insulation film 222 and hence, in establishing contact between the third semiconductor layer 216 and the second electrode 224, there is no possibility that metal for forming the second electrode 224 enters a cavity S which may be formed in the third semiconductor layer 216 and hence, there is no possibility that metal in the inside of the cavity S becomes an electrode potential. Accordingly, even when a negative potential is applied to the second electrode 224, there arises only a phenomenon where a depletion layer extending toward a second electrode 224 side from a pn junction surface between the second semiconductor layer 214 and the third semiconductor layer 216 is brought into contact with the above-mentioned cavity S. Accordingly, it is possible to provide a semiconductor device where breakdown in a reach through mode minimally occurs so that lowering of a breakdown strength is minimized compared to the conventional MOSFET 700.

The semiconductor device 204 according to the embodiment 6 has substantially the same configuration as the semiconductor device 202 according to the embodiment 5 except for a point that the semiconductor device 204 is the planar gate MOSFET in place of the trench gate MOSFET. Accordingly, the semiconductor device 204 according to the embodiment 6 can acquire advantageous effects which correspond to advantageous effects out of advantageous effects which the semiconductor device 202 according to the embodiment 5 can acquire.

Embodiment 7

Figure 12:
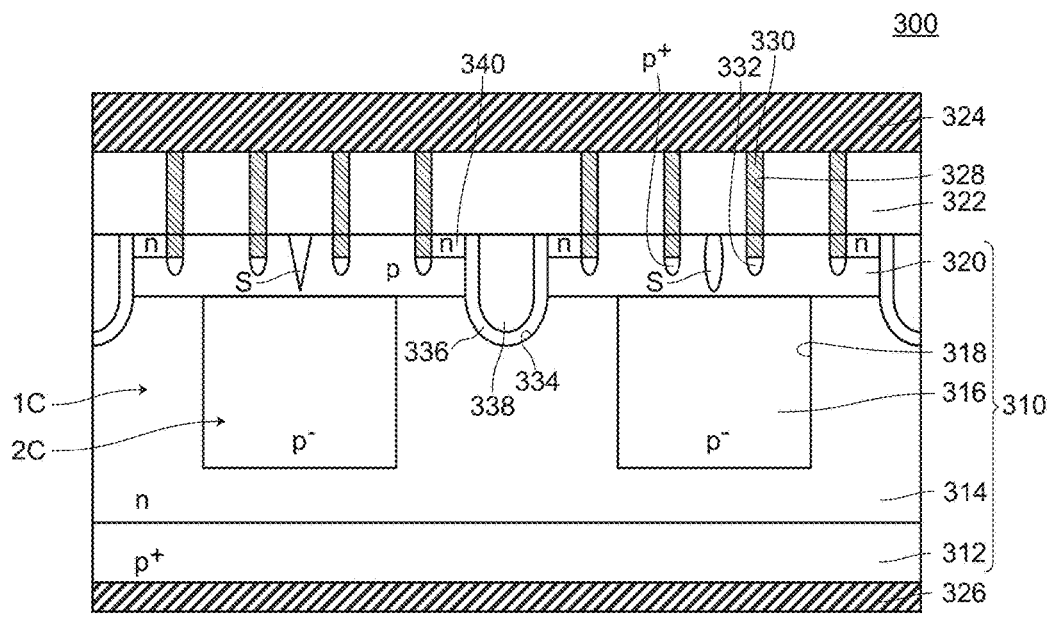
FIG. 12 is an enlarged cross-sectional view showing a main part of a semiconductor device 300 according to an embodiment 7.

A semiconductor device 300 according to an embodiment 7 basically has substantially the same configuration as the semiconductor device 200 according to the embodiment 4. However, the semiconductor device 300 according to the embodiment 7 differs from the semiconductor device 200 according to the embodiment 4 with respect to a point that the semiconductor device 300 is IGBT in place of MOSFET. As shown in FIG. 12, a first semiconductor layer 312 is a p$^+$-type semiconductor layer, and the semiconductor device 300 according to the embodiment 7 is an IGBT of a trench gate type.

In this manner, the semiconductor device 300 according to the embodiment 7 differs from the semiconductor device 200 according to the embodiment 4 with respect to a point that the semiconductor device 300 is the IGBT in place of the MOSFET. However, in the same manner as the semiconductor device 200 according to the embodiment 4, each opening 328 is disposed at a position avoiding a center portion of a third semiconductor layer 316 as viewed in a plan view, and a surface of the center portion of the third semiconductor layer 316 is covered by an interlayer insulation film 322 and hence, in establishing contact between the third semiconductor layer 316 and a second electrode 324, there is no possibility that metal of a metal plug 330 enters a cavity S which may be formed in the third semiconductor layer 316 and hence, there is no possibility that metal in the inside of the cavity S becomes an electrode potential. Accordingly, even when a negative potential is applied to the second electrode 324, there arises only a phenomenon where a depletion layer extending toward a second electrode 324 side from a pn junction surface between a second semiconductor layer 314 and the third semiconductor layer 316 is brought into contact with the above-mentioned cavity S. Accordingly, it is possible to provide a semiconductor device where breakdown in a reach through mode minimally occurs so that lowering of a breakdown strength is minimized compared to the conventional MOSFET 700.

The semiconductor device 300 according to the embodiment 7 has substantially the same configuration as the semiconductor device 200 according to the embodiment 4 except for a point that the semiconductor device 300 is the IGBT in place of the MOSFET. Accordingly, the semiconductor device 300 according to the embodiment 7 can acquire advantageous effects which correspond to advantageous effects out of advantageous effects which the semiconductor device 200 according to the embodiment 4 can acquire.

Although the present invention has been described heretofore with reference to the above-mentioned embodiments, the present invention is not limited to the above-mentioned embodiments. The present invention can be carried out in various modes without departing from the gist of the present invention. For example, the following modifications are also conceivable.

(1) The number, materials, shapes, positions, sizes and the like of the constitutional elements described in the above-mentioned embodiments are merely examples, and can be changed within a range where the advantageous effects of the present invention are not impaired.

Figure 13:
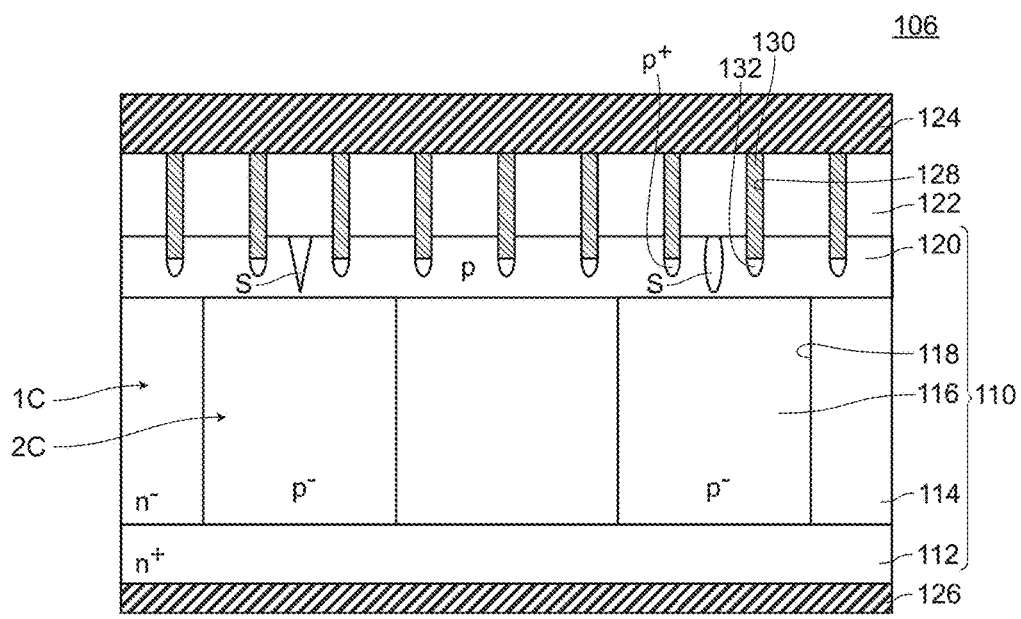
FIG. 13 is an enlarged cross-sectional view showing a main part of a semiconductor device 106 according to a modification 1.

(2) In the above-mentioned respective embodiments, although the depth position of the deepest portion of the trench is shallower than the depth position of the boundary surface between the first semiconductor layer and the second semiconductor layer, the present invention is not limited to such a configuration. The trench may be formed such that the trench extends to a depth position of the deepest portion of the trench where the trench reaches the boundary surface between the first semiconductor layer 112 and the second semiconductor layer 114 (the semiconductor device 106 according to a modification 1, see FIG. 13).

Figure 14:
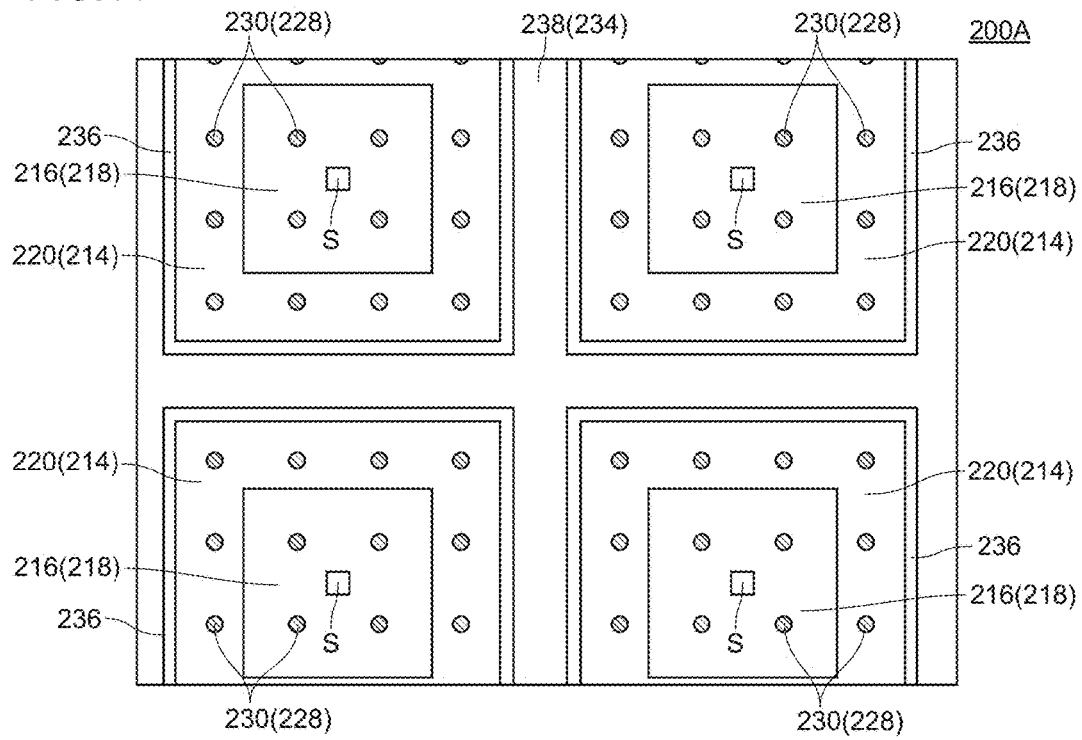
FIG. 14 is an enlarged plan view showing a main part of a semiconductor device 200A according to a modification 2. In the semiconductor device 200A (MOSFET) according to the modification 2, third semiconductor layers 216 (trenches 218) have a quadrangular shape as viewed in a plan view (a columnar shape as viewed in a stereoscopic view), a gate electrode 238 (gate trench 234) has a grid shape as viewed in a plan view, and metal plugs 230 (openings 228) have a circular shape as viewed in a plan view (a columnar shape as viewed in a stereoscopic view).
Figure 15:
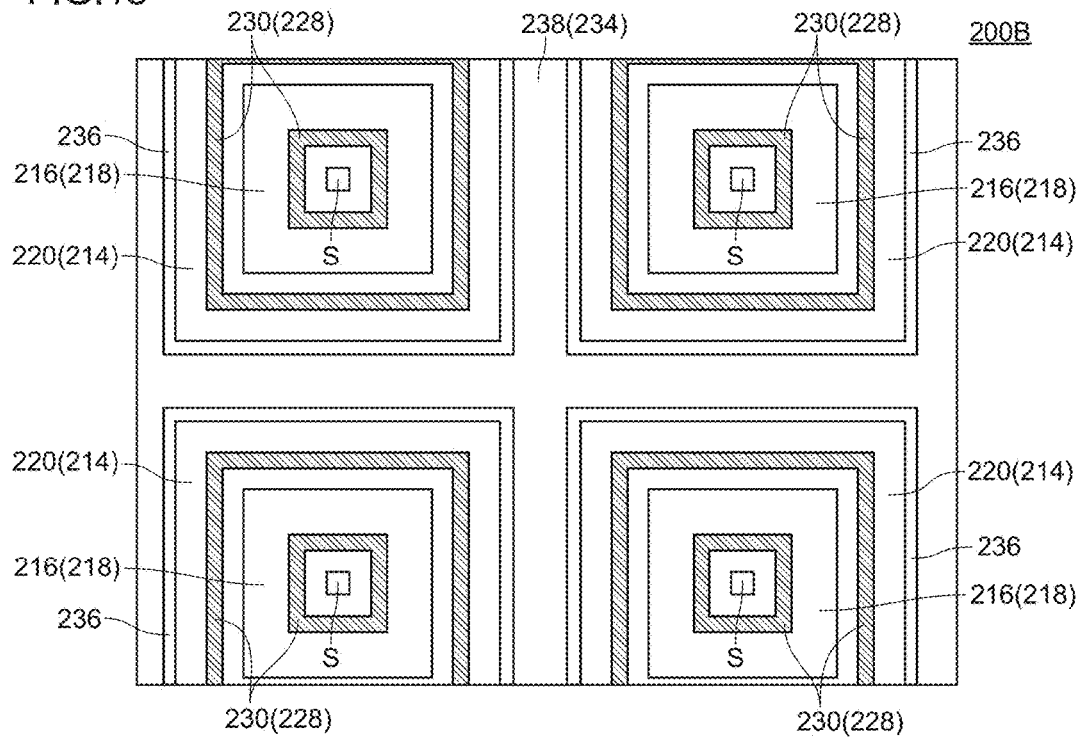
FIG. 15 is an enlarged plan view showing a main part of a semiconductor device 200B according to a modification 3. In the semiconductor device 200B (MOSFET) according to the modification 3, third semiconductor layers 216 (trenches 218) have a quadrangular shape as viewed in a plan view (a columnar shape as viewed in a stereoscopic view), a gate electrode 238 (gate trench 234) has a grid shape as viewed in a plan view, and metal plugs 230 (openings 228) have a frame shape as viewed in a plan view.
Figure 16:
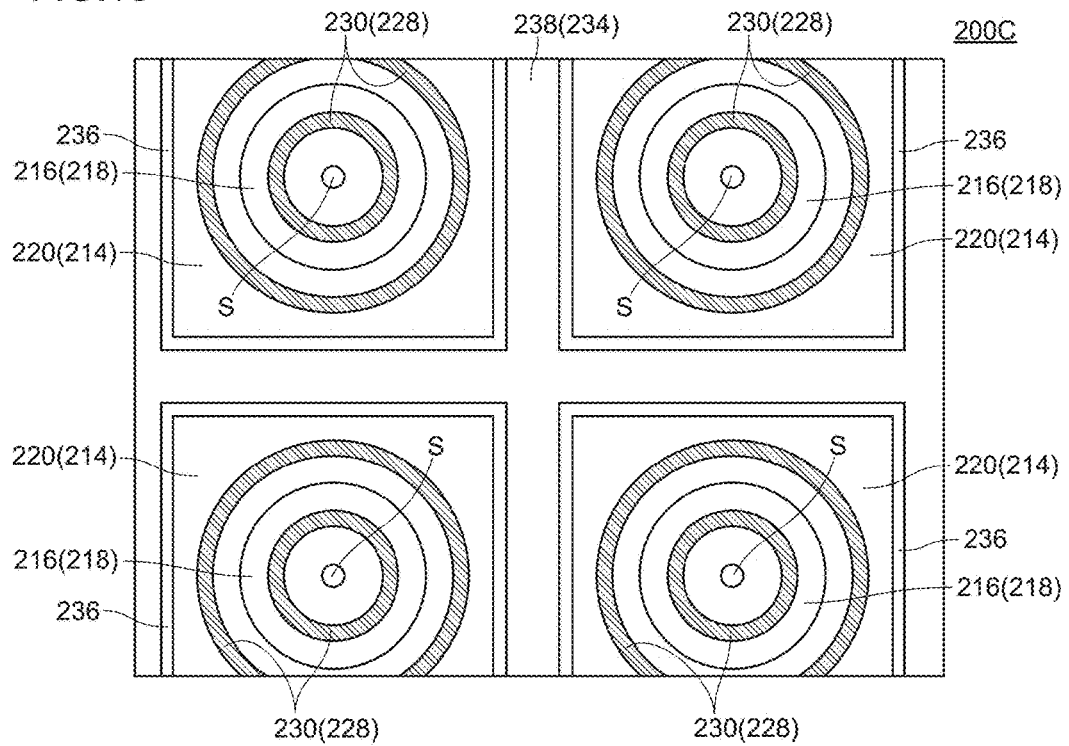
FIG. 16 is an enlarged plan view showing a main part of a semiconductor device 200C according to a modification 4. In the semiconductor device 200C (MOSFET) according to the modification 4, third semiconductor layers 216 (trenches 218) have a circular shape as viewed in a plan view (a columnar shape as viewed in a stereoscopic view), metal plugs 230 (openings 228) have a ring shape as viewed in a plan view, and a gate electrode 238 (gate trench 234) has a grid shape as viewed in a plan view.
Figure 17:
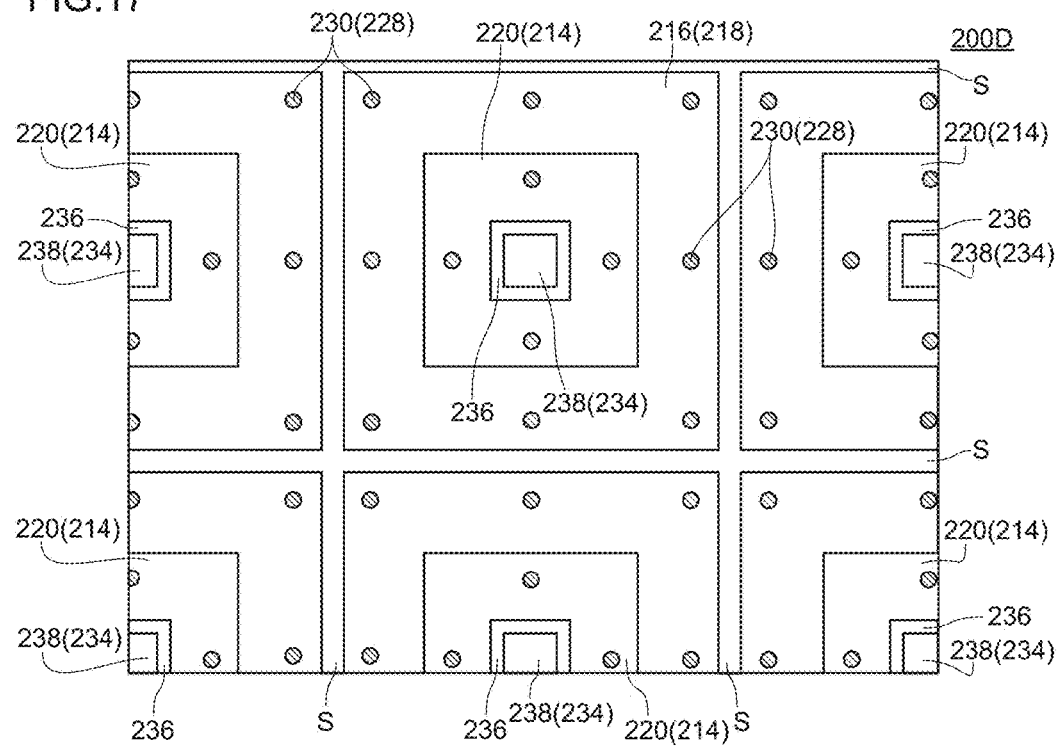
FIG. 17 is an enlarged plan view showing a main part of a semiconductor device 200D according to a modification 5. In the semiconductor device 200D (MOSFET) according to the modification 5, a third semiconductor layer 216 (trench 218) has a grid shape as viewed in a plan view, gate electrodes 238 (gate trenches 234) have a quadrangular shape as viewed in a plan view (a columnar shape as viewed in a stereoscopic view), and metal plugs 230 (openings 228) have a circular shape as viewed in a plan view (a columnar shape as viewed in a stereoscopic view).
Figure 18:
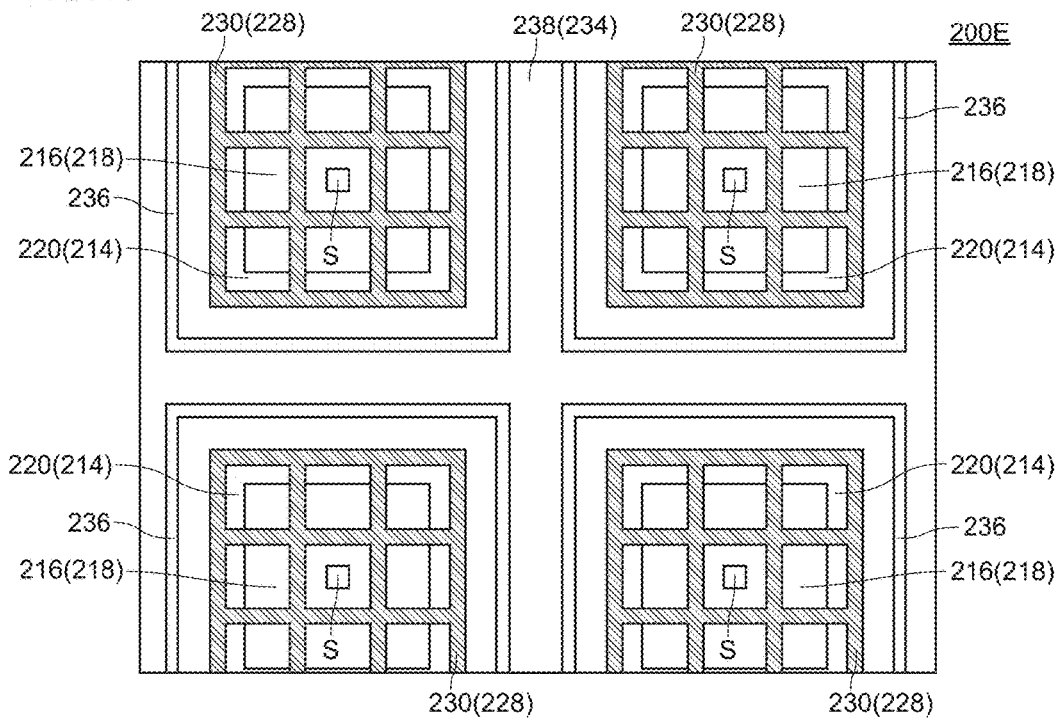
FIG. 18 is an enlarged plan view showing a main part of a semiconductor device 200E according to a modification 6. In the semiconductor device 200E (MOSFET) according to the modification 6, third semiconductor layers 216 (trenches 218) have a quadrangular shape as viewed in a plan view (a columnar shape as viewed in a stereoscopic view), a gate electrode 238 (gate trench 234) has a grid shape as viewed in a plan view, and metal plugs 230 (openings 228) have a grid shape as viewed in a plan view.
Figure 19:
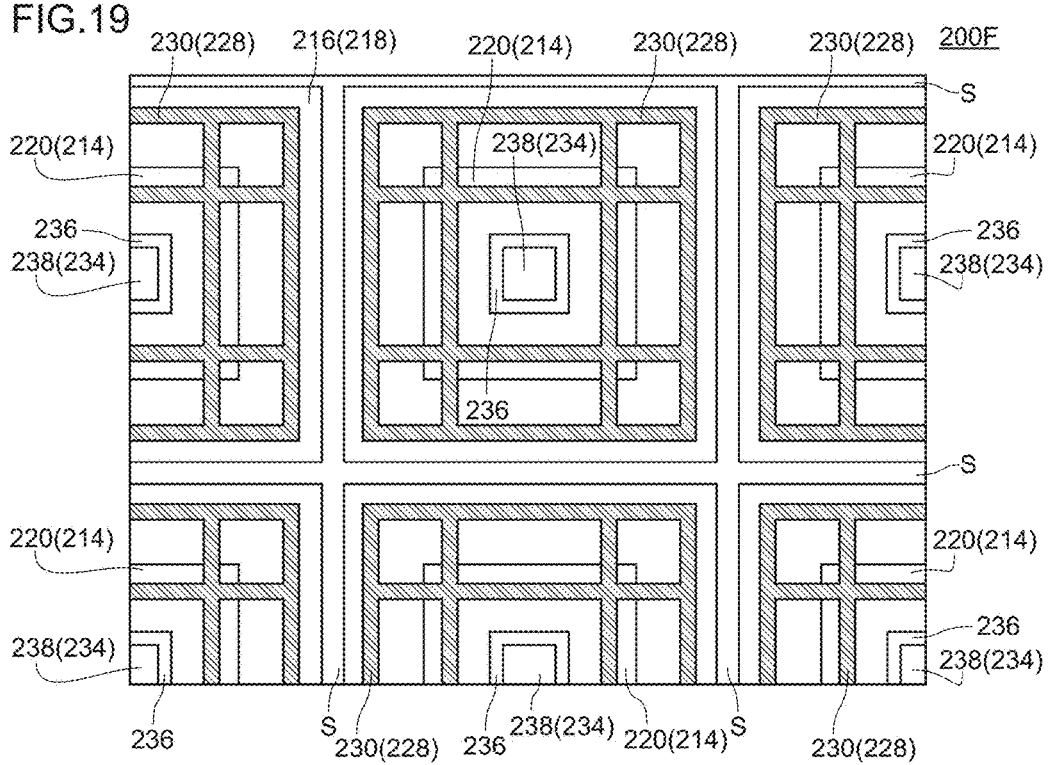
FIG. 19 is an enlarged plan view showing a main part of a semiconductor device 200F according to a modification 7. In the semiconductor device 200F (MOSFET) according to the modification 7, a third semiconductor layer 216 (trench 218) has a grid shape as viewed in a plan view, gate electrodes 238 (gate trenches 234) have a quadrangular shape as viewed in a plan view (a columnar shape as viewed in a stereoscopic view), and metal plugs 230 (openings 228) have a grid shape as viewed in a plan view.

(3) In the above-mentioned respective embodiments, although the third semiconductor layer (trench) is formed in a stripe shape as viewed in a plan view, the present invention is not limited to such a configuration. The third semiconductor layer may be formed into a polygonal shape (for example, a quadrangular shape, see FIG. 14, FIG. 15 and FIG. 18), a circular shape (see FIG. 16), a grid shape (see FIG. 17 and FIG. 19) or other suitable shapes as viewed in a plan view.

(4) In the above-mentioned embodiments 1, 3, 4 and 7, although the opening (metal plug) is formed into a stripe shape as viewed in a plan view, the present invention is not limited to such a configuration. The opening (metal plug) may be formed into a circular shape (see FIG. 14 and FIG. 17), a polygonal shape, a frame shape (see FIG. 15), a ring shape (see FIG. 16), a grid shape (see FIG. 18 and FIG. 19) or other suitable shape as viewed in a plan view.

(5) Although a PIN diode is used as a diode in the above-mentioned embodiments 1 and 2 and a Schottky barrier diode is used as a diode in the embodiment 3, the present invention is not limited to such a configuration. An MPS (Merged PiN/Schottky) diode or a JBS (Junction Barrier Controlled Schottky) diode may be used as a diode.

Figure 20:
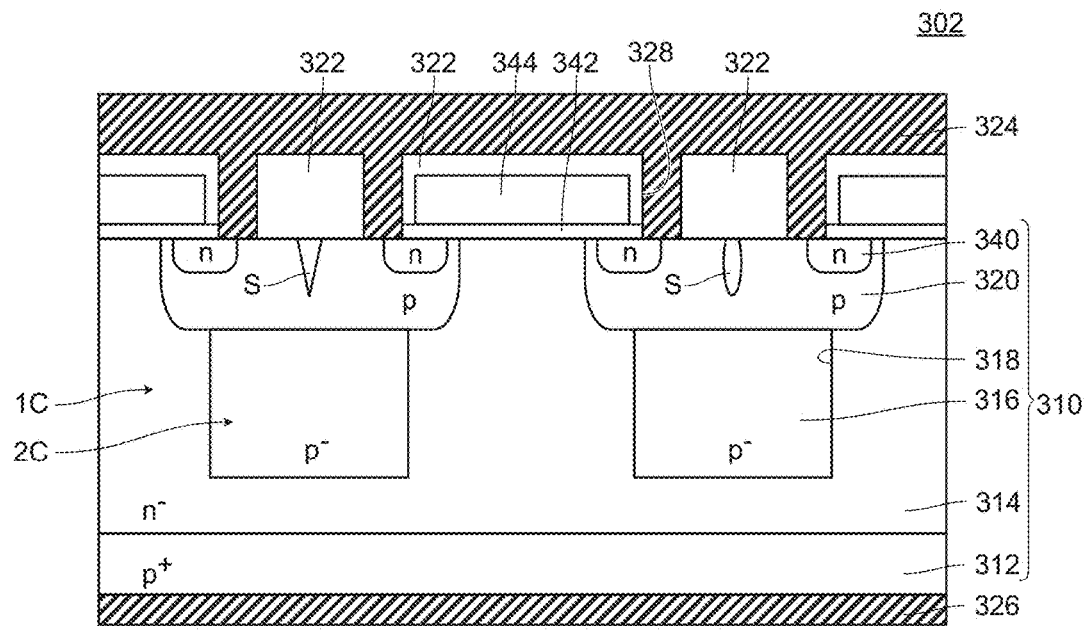
FIG. 20 is an enlarged cross-sectional view showing a main part of a semiconductor device 302 according to a modification 8.
Figure 21:
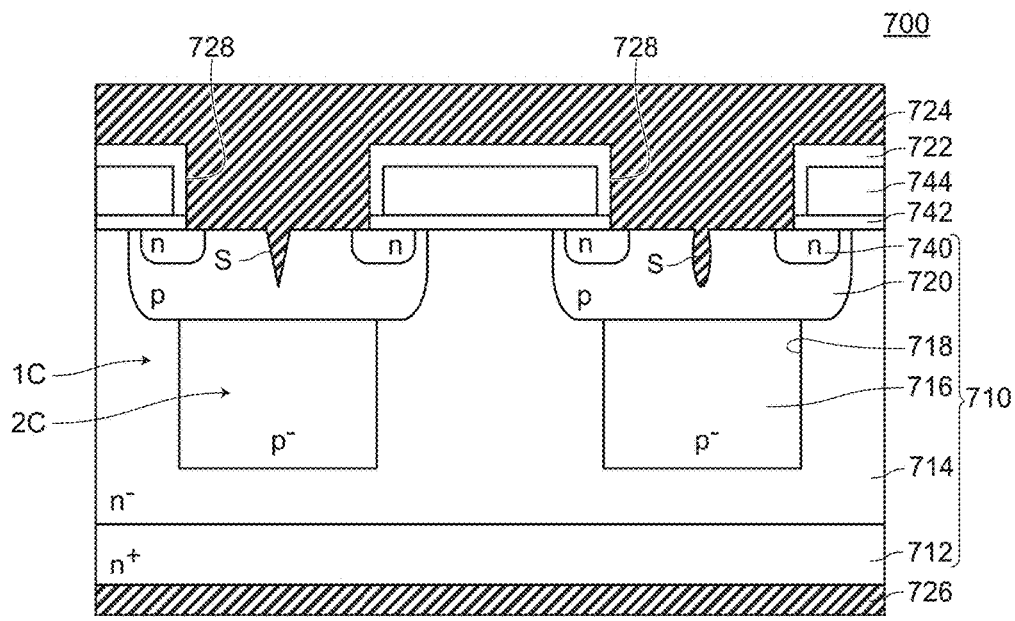
FIG. 21 is an enlarged cross-sectional view showing a main part of a conventional MOSFET 700.

(6) In the above-mentioned embodiment 7, although an IGBT of a trench gate type is used as an IGBT, the present invention is not limited to such a configuration. As an IGBT, an IGBT of a planar gate type may be used (see FIG. 20). In this case, in a semiconductor base body 310, a first semiconductor layer 312 is a p$^+$-type semiconductor layer, and a fourth semiconductor layer 320 is a base layer which is formed on a portion of a surface of a second semiconductor layer 314 and the whole surface of a third semiconductor layer 316, a high concentration diffusion region of a first conductive type 340 is formed on a portion of a surface of the fourth semiconductor layer 320, a semiconductor device 302 includes gate electrodes 344 each of which is formed so as to cover at least the fourth semiconductor layer 320 sandwiched between the high concentration diffusion region of the first conductive type 340 and the second semiconductor layer 314 by way of a gate insulation film 342, and the second electrode 324 is connected to the fourth semiconductor layer 320 and the high concentration diffusion region of the first conductive type 340.

(7) In the above-mentioned embodiment 3, although the second electrode 124 is connected to the third semiconductor layer 116 through the metal plug 130, the present invention is not limited to such a configuration. The second electrode 124 may be directly connected to the third semiconductor layer 116. Further, in the above-mentioned embodiment 6, although the second electrode 224 is directly connected to the fourth semiconductor layer 220, the present invention is not limited to such a configuration. The second electrode 224 may be connected to the fourth semiconductor layer 220 through a metal plug. Still further, in the above-mentioned embodiment 7, although the second electrode 324 is connected to the fourth semiconductor layer 320 through the metal plug 330, the present invention is not limited to such a configuration. The second electrode 324 may be directly connected to the fourth semiconductor layer 320.

(8) A diode is used as the semiconductor device in the above-mentioned embodiments 1 to 3, a MOSFET is used as the semiconductor device in the above-mentioned embodiments 4 to 6, and an IGBT is used as a semiconductor device in the above-mentioned embodiment 7. However, the present invention is not limited to such a configuration. A suitable semiconductor device such as a thyristor or a triac may be used as a semiconductor device.

(9) In the above-mentioned embodiments 2, 5 and 6, although the second electrode is directly connected to the fourth semiconductor layer, the present invention is not limited to such a configuration. A p-type high concentration diffusion region (a high concentration diffusion region of a second conductive type) may be formed directly below an opening, and the second electrode may be connected to the fourth semiconductor layer by way of the p-type high concentration diffusion region.

(10) In the above-mentioned respective embodiments, although the second semiconductor layer is formed of a monocrystal epitaxial layer, the present invention is not limited to such a configuration. The second semiconductor layer may be formed of a layer other than the monocrystal epitaxial layer.

The invention claimed is:

1. A semiconductor device comprising:
a semiconductor base body where a second semiconductor layer of a first conductive type is stacked on a first semiconductor layer of the first conductive type or a second conductive type, a trench having a predetermined depth is formed on a surface of the second semiconductor layer, and a third semiconductor layer of the second conductive type which is formed of a monocrystal epitaxial layer is formed in the inside of the trench;
a first electrode which is positioned on a surface of the first semiconductor layer;
an interlayer insulation film which is positioned on a surface of the second semiconductor layer and on a surface of the third semiconductor layer and has a predetermined opening formed within a region where at least the third semiconductor layer is formed as viewed in a plan view, the opening being filled with metal; and
a second electrode which is positioned over the interlayer insulation film, wherein
the opening is disposed at a position avoiding a center portion of the third semiconductor layer as viewed in a plan view,
the second electrode is connected to at least the third semiconductor layer through the metal filled in the opening, and
a surface of the center portion of the third semiconductor layer is covered by the interlayer insulation film.

2. The semiconductor device according to claim 1, wherein a length from a center of the third semiconductor layer to a side wall of the opening closest to the center of the third semiconductor layer out of the side walls of the opening is set to 0.1 mm or more as viewed in a plan view.

3. The semiconductor device according to claim 1, further comprising a metal plug which is formed by filling the inside of the opening with metal which differs from metal for forming the second electrode, and
the second electrode is connected to at least the third semiconductor layer through the metal plug.

4. The semiconductor device according to claim 1, wherein metal for forming the second electrode is filled in the opening directly, and
the second electrode is directly connected to at least the third semiconductor layer.

5. The semiconductor device according to claim 1, wherein a fourth semiconductor layer of the second conductive type is formed on at least a portion of a surface of the second semiconductor layer and on a surface of the third semiconductor layer of the semiconductor base body, and
assuming a portion of the second semiconductor layer sandwiched between the trenches disposed adjacently to each other and being deeper than the fourth semiconductor layer as a first column and assuming a portion of the third semiconductor layer deeper than the fourth semiconductor layer as a second column, a super junction structure is formed of the first column and the second column.

6. The semiconductor device according to claim 5, wherein the semiconductor device is a PIN diode where the fourth semiconductor layer is formed on a whole surface of the second semiconductor layer and a whole surface of the third semiconductor layer, and the second electrode is connected to the fourth semiconductor layer.

7. The semiconductor device according to claim 5, wherein
the semiconductor base body is configured such that
the first semiconductor layer is a semiconductor layer of the first conductive type,
the fourth semiconductor layer is a base layer which is formed on a whole surface of the second semiconductor layer and on a whole surface of the third semiconductor layer,
a high concentration diffusion region of the first conductive type is formed on a surface of the fourth semiconductor layer, and
the semiconductor device is a MOSFET of a trench gate type which further comprises:
a gate trench which is positioned in a region where the trench is not formed as viewed in a plan view, and is formed such that the gate trench extends to a depth position deeper than a deepest portion of the fourth semiconductor layer, and a portion of the high concentration diffusion region of the first conductive type is exposed on an inner peripheral surface of the gate trench;
a gate insulation film formed on the inner peripheral surface of the gate trench, and
a gate electrode which is filled in the gate trench with the gate insulation film interposed therebetween, and
the second electrode is connected to the fourth semiconductor layer and the high concentration diffusion region of the first conductive type.

8. The semiconductor device according to claim 5, wherein
the semiconductor base body is configured such that
the first semiconductor layer is a semiconductor layer of the first conductive type, the fourth semiconductor layer is a base layer which is formed on a portion of the surface of the second semiconductor layer and a whole surface of the third semiconductor layer, a high concentration diffusion region of the first conductive type is formed on a portion of a surface of the fourth semiconductor layer, and the semiconductor device is a MOSFET of a planar gate type which further comprises a gate electrode by way of a gate insulation film such that the gate electrode covers at least the fourth semiconductor layer sandwiched between the high concentration diffusion region of the first conductive type and the second semiconductor layer, and the second electrode is connected to the fourth semiconductor layer and the high concentration diffusion region of the first conductive type.

9. The semiconductor device according to claim 5, wherein the semiconductor base body is configured such that the first semiconductor layer is a semiconductor layer of the second conductive type, the fourth semiconductor layer is a base layer which is formed on a whole surface of the second semiconductor layer and a whole surface of the third semiconductor layer, a high concentration diffusion region of the first conductive type is formed on a surface of the fourth semiconductor layer, and the semiconductor device is an IGBT of a trench gate type which further comprises:

a gate trench which is positioned in a region where the trench is not formed as viewed in a plan view, and is formed such that the gate trench extends to a depth position deeper than a deepest portion of the fourth semiconductor layer, and a portion of the high concentration diffusion region of the first conductive type is exposed on an inner peripheral surface of the gate trench;

a gate insulation film formed on the inner peripheral surface of the gate trench, and a gate electrode which is filled in the gate trench with the gate insulation film interposed therebetween, and the second electrode is connected to the fourth semiconductor layer and the high concentration diffusion region of the first conductive type.

10. The semiconductor device according to claim 5, wherein the semiconductor base body is configured such that the first semiconductor layer is a semiconductor layer of the second conductive type, the fourth semiconductor layer is a base layer which is formed on a portion of the surface of the second semiconductor layer and a whole surface of the third semiconductor layer, a high concentration diffusion region of the first conductive type is formed on a portion of a surface of the fourth semiconductor layer, and the semiconductor device is an IGBT of a planar gate type which further comprises a gate electrode by way of a gate insulation film such that the gate electrode covers at least the fourth semiconductor layer sandwiched between the high concentration diffusion region of the first conductive type and the second semiconductor layer, and the second electrode is connected to the fourth semiconductor layer and the high concentration diffusion region of the first conductive type.

11. The semiconductor device according to claim 5, wherein a high concentration diffusion region of the second conductive type having higher dopant concentration than the fourth semiconductor layer is formed right below the opening so as to be in contact with a bottom surface of the opening.

12. The semiconductor device according to claim 1, wherein assuming a portion of the second semiconductor layer sandwiched between the trenches disposed adjacently to each other as a first column and assuming a portion of the third semiconductor layer as a second column, a super junction structure is formed of the first column and the second column.

13. The semiconductor device according to claim 12, wherein the semiconductor device is a Schottky barrier diode where the metal is a barrier metal, and the second electrode is connected to the second semiconductor layer in addition to the third semiconductor layer.

14. The semiconductor device according to claim 1, wherein the second semiconductor layer is formed of a monocrystal epitaxial layer.

15. A method of manufacturing a semiconductor device for manufacturing the semiconductor device described in claim 1, the method comprising in the following order:

a semiconductor base body preparation step of preparing the semiconductor body where the second semiconductor layer of the first conductive type is stacked on the first semiconductor layer of the first conductive type or the second conductive type, the trench having the predetermined depth is formed on the surface of the second semiconductor layer, and the third semiconductor layer of the second conductive type which is formed of the monocrystal epitaxial layer is formed in the inside of the trench;

an interlayer insulation film forming step of forming the interlayer insulation film on the surfaces of the second semiconductor layer and the third semiconductor layer;

an opening forming step of forming the predetermined opening in the interlayer insulation film within at least the region where the third semiconductor layer is formed;

a metal plug forming step of forming a metal plug by filling metal which differs from metal for forming the second electrode in the opening; and an electrode forming step of forming the first electrode on the surface of the first semiconductor layer and the second electrode connected to at least the third semiconductor layer on the interlayer insulation film through the metal plug, wherein the opening is formed at the position avoiding the center portion of the third semiconductor layer as viewed in a plan view in the opening forming step, and a surface of the center portion of the third semiconductor layer is covered by the interlayer insulation film in the opening forming step, the metal plug forming step and the electrode forming step.

16. A method of manufacturing a semiconductor device for manufacturing the semiconductor device described in claim 1, the method comprising in the following order:

a semiconductor base body preparation step of preparing the semiconductor body where the second semiconductor layer of the first conductive type is stacked on the first semiconductor layer of the first conductive type or the second conductive type, the trench having the predetermined depth is formed on the surface of the second semiconductor layer, and the third semiconductor layer of the second conductive type which is formed of the monocrystal epitaxial layer is formed in the inside of the trench;

an interlayer insulation film forming step of forming the interlayer insulation film on the surfaces of the second semiconductor layer and the third semiconductor layer;

an opening forming step of forming the predetermined opening in the interlayer insulation film within at least the region where the third semiconductor layer is formed; and an electrode forming step which includes: a step of forming the first electrode on a surface of the first semiconductor layer; and a step of forming the second electrode on the interlayer insulation film where metal for forming the second electrode is directly filled in the opening and the second electrode is directly connected to at least the third semiconductor layer, wherein the opening is formed at the position avoiding the center portion of the third semiconductor layer as viewed in a plan view in the opening forming step, and a surface of the center portion of the third semiconductor layer is covered by the interlayer insulation film in the opening forming step and the electrode forming step.

* * * * *